United States Patent
Kim et al.

(10) Patent No.: US 12,402,321 B2
(45) Date of Patent: Aug. 26, 2025

(54) VERTICAL CHANNEL SEMICONDUCTOR DEVICE WITH FERROELECTRIC-INSULATOR GATE STACK

(71) Applicant: Samsung Electronics Co., Ltd., Suwon-si (KR)

(72) Inventors: Hyuncheol Kim, Seoul (KR); Yongseok Kim, Suwon-si (KR); Dongsoo Woo, Seoul (KR); Kyunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 551 days.

(21) Appl. No.: 17/679,255

(22) Filed: Feb. 24, 2022

(65) Prior Publication Data
US 2022/0406797 A1    Dec. 22, 2022

(30) Foreign Application Priority Data
Jun. 18, 2021    (KR) .................. 10-2021-0079264

(51) Int. Cl.
*H01L 29/78*    (2006.01)
*H01L 29/12*    (2006.01)
(Continued)

(52) U.S. Cl.
CPC ............ *H10B 51/30* (2023.02); *H10B 51/40* (2023.02)

(58) Field of Classification Search
CPC ............ H01L 21/28291; H01L 29/516; H01L 29/6684; H01L 29/78391; H01L 27/11514; H01L 27/11597; G11C 11/223; H10D 30/6735; H10D 30/6757; H10D 62/121; H10D 84/85; H10D 62/151
See application file for complete search history.

(56) References Cited

U.S. PATENT DOCUMENTS 5,160,491 A * 11/1992 Mori .................. H01L 29/0847
                                                              438/270
5,407,846 A *  4/1995 Chan .................. H01L 29/6675
                                                              438/156
(Continued)

FOREIGN PATENT DOCUMENTS

KR    10-2020-0081005 A    7/2020
TW         201916371 A    4/2019
(Continued)

*Primary Examiner* — Ajay Ojha
*Assistant Examiner* — Tsz K Chiu
(74) *Attorney, Agent, or Firm* — Muir Patent Law, PLLC

(57) ABSTRACT

A semiconductor device includes a plurality of first conductive lines extending in a first direction and spaced apart from each other in a second direction intersecting the first direction, the first direction and second direction being horizontal directions, a plurality of vertical semiconductor patterns disposed on the plurality of first conductive lines, respectively, a gate electrode crossing the plurality of first conductive lines and penetrating each of the plurality of vertical semiconductor patterns, a ferroelectric pattern between the gate electrode and each of the plurality of vertical semiconductor patterns, and a gate insulating pattern between the ferroelectric pattern and each of the plurality of vertical semiconductor patterns.

21 Claims, 27 Drawing Sheets

(51) Int. Cl.
*H01L 29/66* (2006.01)
*H10B 51/30* (2023.01)
*H10B 51/40* (2023.01)

(56) References Cited

U.S. PATENT DOCUMENTS

| | | | | |
|---|---|---|---|---|
| 5,527,720 A * | 6/1996 | Goodyear | ........... | H01L 29/7811 |
| | | | | 438/273 |
| 7,786,530 B2 * | 8/2010 | Kakoschke | ..... | H01L 21/823425 |
| | | | | 257/287 |
| 7,825,462 B2 * | 11/2010 | Tang | ................... | H01L 29/1037 |
| | | | | 257/296 |
| 8,766,349 B2 * | 7/2014 | Park | ....................... | H10B 69/00 |
| | | | | 257/314 |
| 9,397,110 B2 * | 7/2016 | Lue | ..................... | H01L 27/0207 |
| 9,818,848 B2 | 11/2017 | Sun et al. | | |
| 9,837,435 B1 | 12/2017 | Chang et al. | | |
| 10,062,426 B2 | 8/2018 | Karda et al. | | |
| 10,461,095 B2 | 10/2019 | Dong et al. | | |
| 10,629,732 B1 * | 4/2020 | Sills | ................... | H01L 29/7869 |
| 10,818,769 B2 | 10/2020 | Yamaguchi | | |
| 10,825,834 B1 * | 11/2020 | Chen | ...................... | H10B 51/20 |
| 10,998,408 B2 | 5/2021 | Yamaguchi | | |
| 11,114,565 B2 | 9/2021 | Ota et al. | | |
| 11,139,396 B2 * | 10/2021 | Karda | ................. | H01L 29/7827 |
| 11,227,828 B2 | 1/2022 | Ho et al. | | |
| 11,289,488 B2 * | 3/2022 | Shin | ..................... | G11C 5/063 |
| 2006/0073706 A1 | 4/2006 | Li et al. | | |
| 2007/0228434 A1 | 10/2007 | Shimojo | | |
| 2015/0041899 A1 * | 2/2015 | Yang | ................. | H10D 30/6735 |
| | | | | 257/351 |
| 2015/0084041 A1 * | 3/2015 | Hur | ..................... | H10D 30/611 |
| | | | | 257/43 |
| 2015/0380430 A1 * | 12/2015 | Lai | ................... | H01L 21/02532 |
| | | | | 257/314 |
| 2016/0141299 A1 * | 5/2016 | Hong | ..................... | H10B 43/35 |
| | | | | 438/157 |
| 2016/0358932 A1 * | 12/2016 | Yang | .................... | H01L 29/0649 |
| 2016/0365440 A1 * | 12/2016 | Suk | ...................... | H10D 30/024 |
| 2018/0175042 A1 * | 6/2018 | Jang | ..................... | H01L 21/3003 |
| 2018/0269229 A1 * | 9/2018 | Or-Bach | ............ | H01L 29/0673 |
| 2018/0358475 A1 | 12/2018 | Guo et al. | | |
| 2018/0374926 A1 * | 12/2018 | Lee | ...................... | H10D 64/671 |
| 2019/0067375 A1 | 2/2019 | Karda et al. | | |
| 2019/0206869 A1 * | 7/2019 | Kim | ...................... | H10B 12/20 |
| 2020/0013899 A1 * | 1/2020 | Kim | ...................... | B82Y 10/00 |
| 2020/0027897 A1 * | 1/2020 | Zhu | ...................... | H10B 53/20 |
| 2020/0035696 A1 * | 1/2020 | Zhu | ...................... | H10B 51/20 |
| 2020/0043941 A1 * | 2/2020 | Kim | ...................... | H10B 43/40 |
| 2020/0194431 A1 | 6/2020 | Castro et al. | | |
| 2020/0203381 A1 | 6/2020 | Rabkin et al. | | |
| 2020/0212068 A1 | 7/2020 | Lee et al. | | |
| 2021/0074725 A1 | 3/2021 | Lue | | |
| 2021/0074726 A1 * | 3/2021 | Lue | ...................... | H10B 51/30 |
| 2022/0406848 A1 * | 12/2022 | Kim | ...................... | H10K 19/10 |
| 2023/0328961 A1 * | 10/2023 | Cho | ..................... | H10B 12/315 |

FOREIGN PATENT DOCUMENTS

| | | |
|---|---|---|
| TW | 201941437 A | 10/2019 |
| TW | 202004915 A | 1/2020 |
| TW | 202103304 A | 1/2021 |
| TW | 202113974 A | 4/2021 |

\* cited by examiner

VERTICAL CHANNEL SEMICONDUCTOR DEVICE WITH FERROELECTRIC-INSULATOR GATE STACK

CROSS-REFERENCE TO RELATED APPLICATION

This U.S. non-provisional patent application claims priority under 35 U.S.C. § 119 to Korean Patent Application No. 10-2021-0079264, filed on Jun. 18, 2021, in the Korean Intellectual Property Office, the disclosure of which is hereby incorporated by reference in its entirety.

BACKGROUND

Embodiments of the inventive concepts relate to semiconductor devices and methods of manufacturing the same, and more particularly, to semiconductor memory devices including vertical channel transistors and methods of manufacturing the same.

Semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device. In addition, next-generation non-volatile semiconductor memory devices (e.g., magnetic random access memory (MRAM) devices, phase-change random access memory (PRAM) devices, and ferroelectric random access memory (FeRAM) devices) have been developed to provide high-performance and low power consumption semiconductor memory devices.

Various techniques using semiconductor devices having different properties are being studied to improve an integration density and performance of a semiconductor device.

SUMMARY

Embodiments of the inventive concepts may provide semiconductor devices capable of easily increasing an integration density and methods of manufacturing the same.

Embodiments of the inventive concepts may also provide semiconductor devices capable of improving operating characteristics and reliability and methods of manufacturing the same.

In an aspect, a semiconductor device may include a plurality of first conductive lines extending in a first direction and spaced apart from each other in a second direction intersecting the first direction, the first direction and second direction being horizontal directions, a plurality of vertical semiconductor patterns disposed on the plurality of first conductive lines, respectively, a gate electrode crossing the plurality of first conductive lines and penetrating each of the plurality of vertical semiconductor patterns, a ferroelectric pattern between the gate electrode and each of the plurality of vertical semiconductor patterns, and a gate insulating pattern between the ferroelectric pattern and each of the plurality of vertical semiconductor patterns.

In an aspect, a semiconductor device may include a plurality of vertical semiconductor patterns on a substrate, the plurality of vertical semiconductor patterns spaced apart from each other in a first direction and a second direction which are parallel to a top surface of the substrate and intersect each other, the plurality of vertical semiconductor patterns extending in a third direction perpendicular to the top surface of the substrate, and a plurality of gate structures spaced apart from each other in the first direction and extending in the second direction on the substrate. Each of the plurality of gate structures may penetrate each vertical semiconductor pattern of corresponding vertical semiconductor patterns, spaced apart from each other in the second direction, of the plurality of vertical semiconductor patterns. Each of the plurality of gate structures may include a gate electrode penetrating the corresponding vertical semiconductor patterns, a ferroelectric pattern between the gate electrode and each of the corresponding vertical semiconductor patterns, and a gate insulating pattern between the ferroelectric pattern and each of the corresponding vertical semiconductor patterns.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

Figure 1:
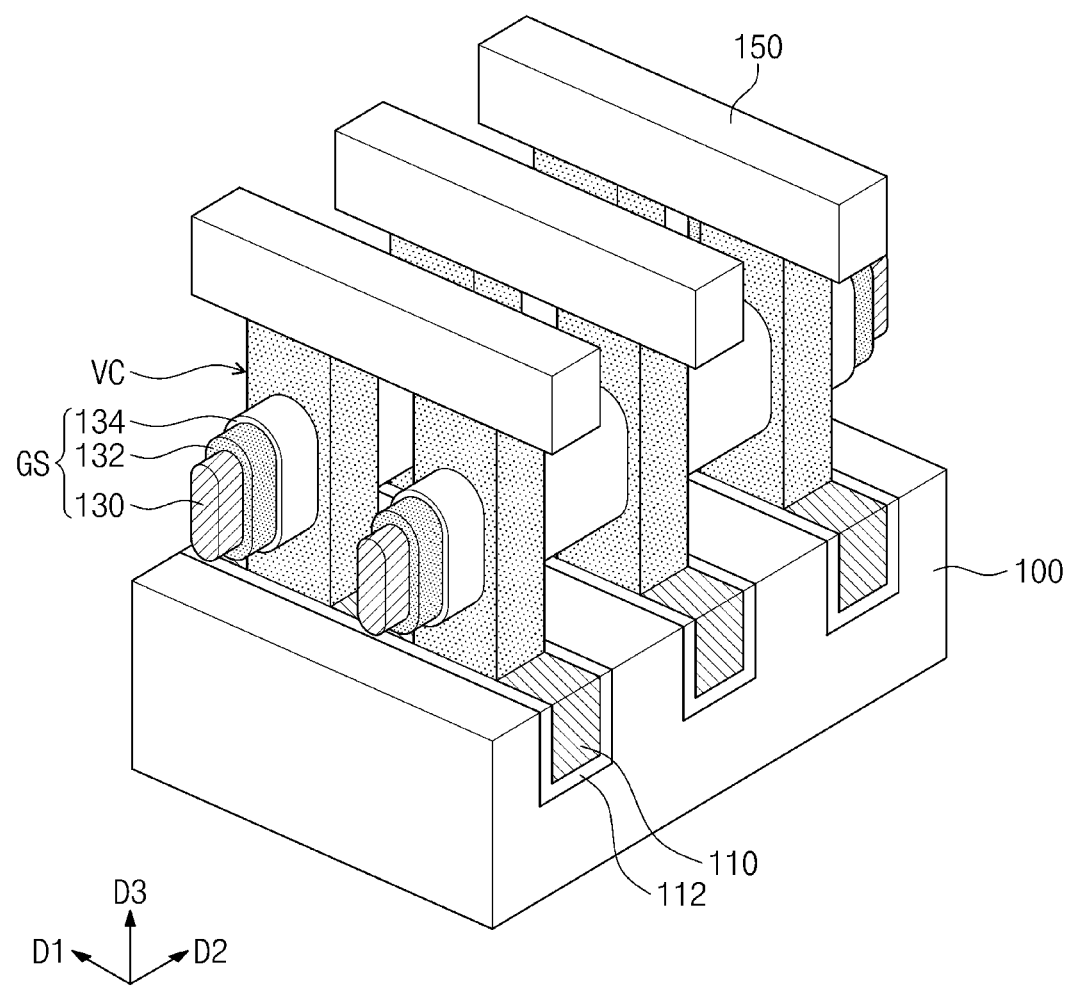
FIG. 1 is a schematic perspective view illustrating a semiconductor device according to some embodiments of the inventive concepts.

FIG. 1 is a schematic perspective view illustrating a semiconductor device according to some embodiments of the inventive concepts.

Referring to FIG. 1, a plurality of first conductive lines 110 may extend in a first direction D1 and may be spaced apart from each other in a second direction D2 intersecting the first direction D1 (e.g., perpendicular to the first direction D1). The plurality of first conductive lines 110 may be formed in or on a semiconductor substrate 100. A plurality of vertical semiconductor patterns VC may be disposed on the plurality of first conductive lines 110. The plurality of vertical semiconductor patterns VC may be two-dimensionally arranged (from a plan view) in the first direction D1 and the second direction D2 and may be spaced apart from each other in the first direction D1 and the second direction D2. Vertical semiconductor patterns VC (e.g., a set of vertical semiconductor patterns VC), spaced apart from each other in the first direction D1, of the plurality of vertical semiconductor patterns VC may be connected to a corresponding one of the plurality of first conductive lines 110. Vertical semiconductor patterns VC, spaced apart from each other in the second direction D2, of the plurality of vertical semiconductor patterns VC may be connected to the plurality of first conductive lines 110, respectively. Each of the plurality of first conductive lines 110 may be connected to a set of corresponding vertical semiconductor patterns VC, spaced apart from each other in the first direction D1, of the plurality of vertical semiconductor patterns VC. The plurality of vertical semiconductor patterns VC may extend (e.g., lengthwise) in a third direction D3 perpendicular to both the first direction D1 and the second direction D2. The first direction D1 and second direction D2 may be described as horizontal directions, and the third direction D3 may be described as a vertical direction. An item, layer, or portion of an item or layer described as extending "lengthwise" in a particular direction has a length in the particular direction and a width perpendicular to that direction, where the length is greater than the width.

A plurality of gate structures GS may be disposed on the plurality of first conductive lines 110 and may cross the plurality of first conductive lines 110 (e.g., from a plan view). The plurality of gate structures GS may be spaced apart from each other in the first direction D1 and may extend (e.g., lengthwise) in the second direction D2. Each of the plurality of gate structures GS may penetrate and pass through each vertical semiconductor pattern VA of a set of corresponding vertical semiconductor patterns VC, spaced apart from each other in the second direction D2, of the plurality of vertical semiconductor patterns VC.

Each of the plurality of gate structures GS may include a gate electrode 130 extending in the second direction D2. The gate electrode 130 may penetrate the each vertical semiconductor pattern VC of the set of corresponding vertical semiconductor patterns VC and may cross the plurality of first conductive lines 110 (e.g., from a plan view). Each of the corresponding vertical semiconductor patterns VC may surround an outer surface of the gate electrode 130. Each of the plurality of gate structures GS may further include a ferroelectric pattern 132 between the gate electrode 130 and each of the corresponding vertical semiconductor patterns VC, and a gate insulating pattern 134 between the ferroelectric pattern 132 and each of the corresponding vertical semiconductor patterns VC. The ferroelectric pattern 132 may surround the outer surface of the gate electrode 130 and may extend (e.g., lengthwise) in the second direction D2. The gate insulating pattern 134 may surround an outer surface of the ferroelectric pattern 132 and may extend (e.g., lengthwise) in the second direction D2. Each of the corresponding vertical semiconductor patterns VC may surround an outer surface of the gate insulating pattern 134. The gate electrode 130, the ferroelectric pattern 132 and the gate insulating pattern 134 may be disposed inside each of the corresponding vertical semiconductor patterns VC, to be completely surrounded in the first direction D1 and third direction D3 by the corresponding vertical semiconductor patterns VC where they intersect the corresponding vertical semiconductor patterns VC.

A plurality of second conductive lines 150 may be disposed on the plurality of vertical semiconductor patterns VC. The plurality of second conductive lines 150 may cross the plurality of gate structures GS (e.g., from a plan view). The plurality of second conductive lines 150 may extend (e.g., lengthwise) in the first direction D1 and may be spaced apart from each other in the second direction D2. The vertical semiconductor patterns VC, spaced apart from each other in the first direction D1, of the plurality of vertical semiconductor patterns VC may be connected to a corresponding one of the plurality of second conductive lines 150. The vertical semiconductor patterns VC, spaced apart from each other in the second direction D2, of the plurality of vertical semiconductor patterns VC may be connected to the plurality of second conductive lines 150, respectively. Each of the plurality of second conductive lines 150 may be connected to corresponding vertical semiconductor patterns VC, spaced apart from each other in the first direction D1, of the plurality of vertical semiconductor patterns VC.

Figure 2:
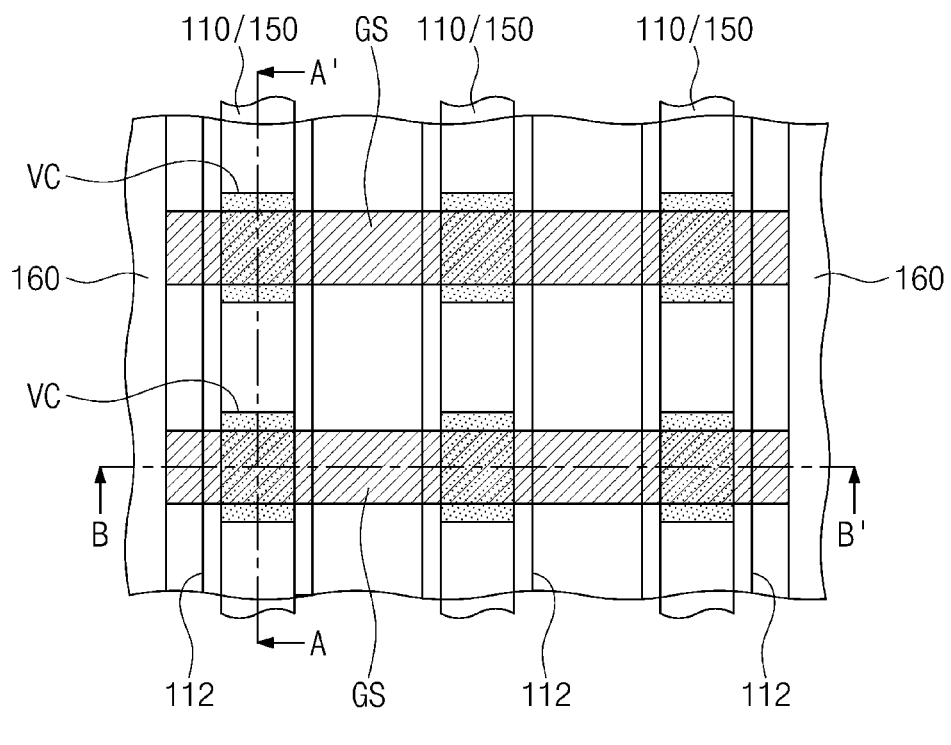
FIG. 2 is a plan view illustrating a semiconductor device according to some embodiments of the inventive concepts.
Figure 2:
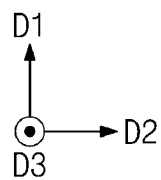
Figure 3:
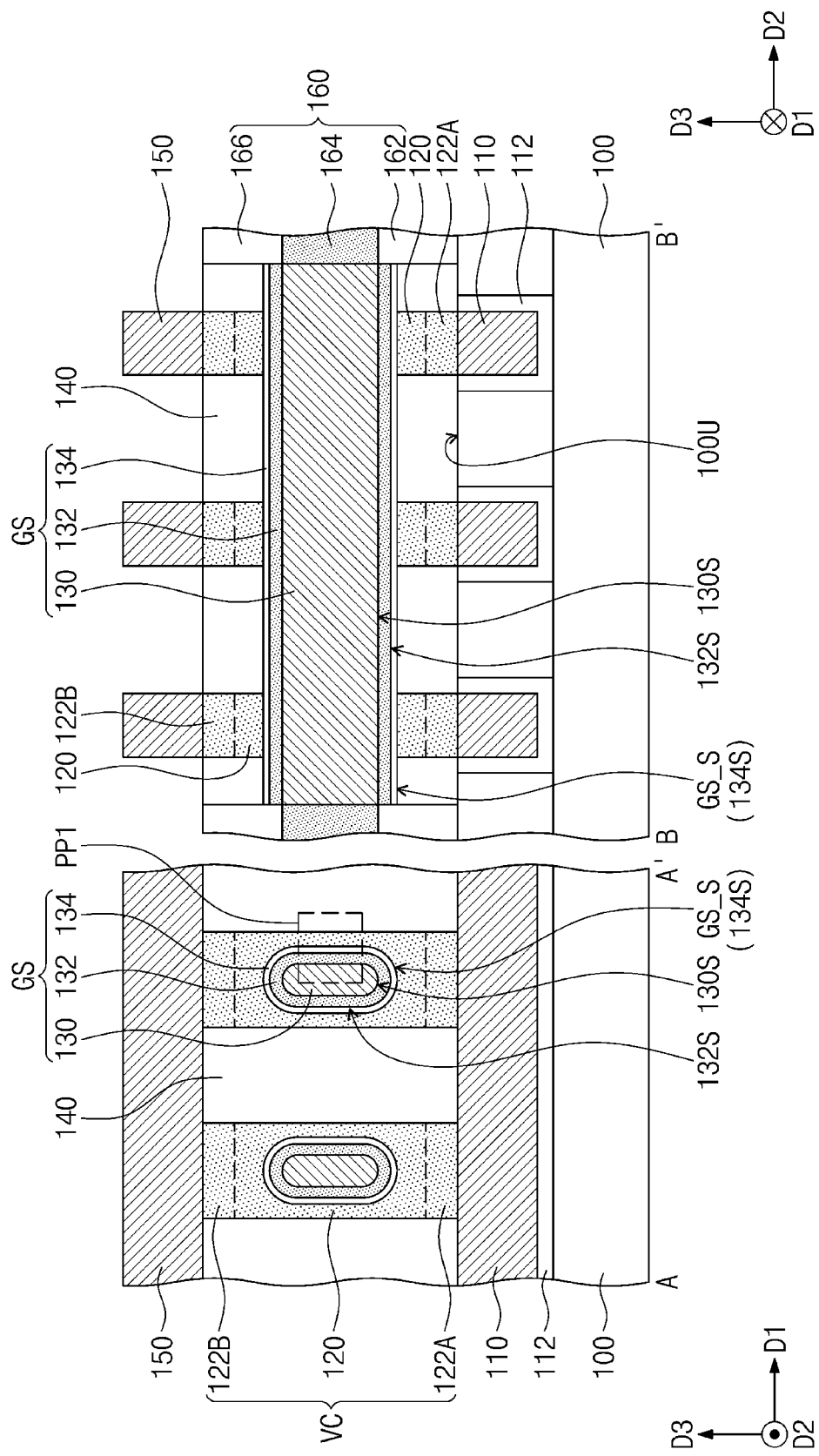
FIG. 3 is a cross-sectional view taken along lines A-A' and B-B' of FIG. 2.
Figure 4A:
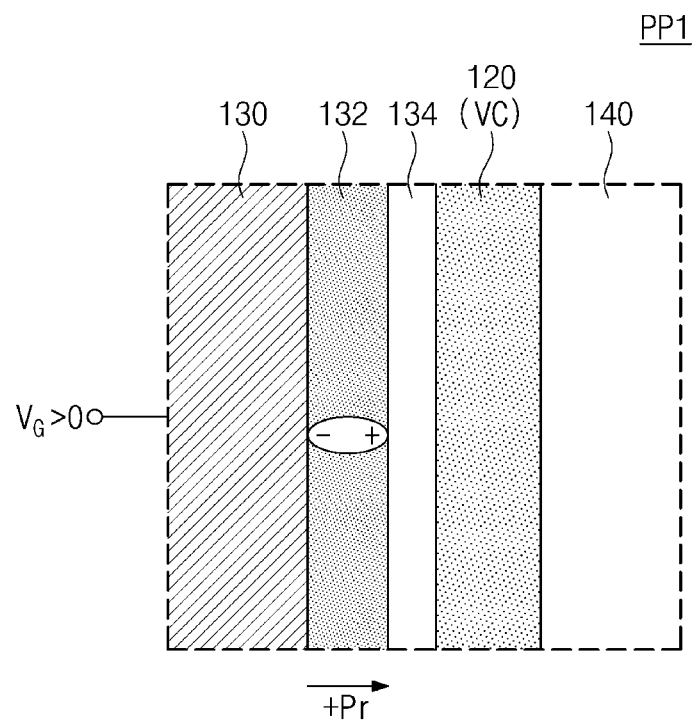
FIGS. 4A and 4B are enlarged views of a portion 'PP1' of FIG. 3.
Figure 4B:
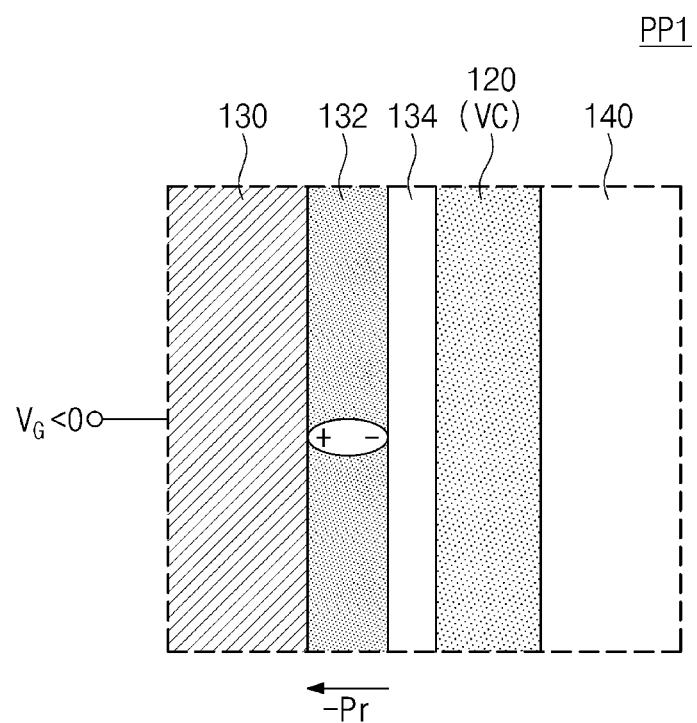
Figure 5:
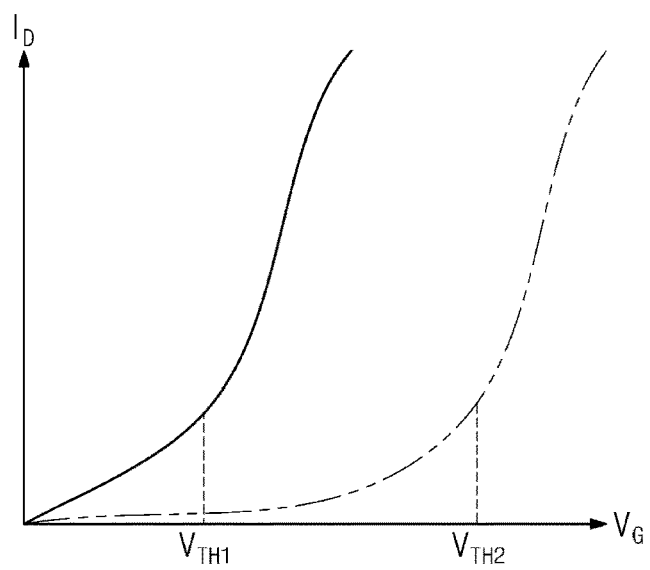
FIG. 5 is a graph showing threshold voltage properties of a ferroelectric field-effect transistor according to some embodiments of the inventive concepts.

FIG. 2 is a plan view illustrating a semiconductor device according to some embodiments of the inventive concepts, and FIG. 3 is a cross-sectional view taken along lines A-A' and B-B' of FIG. 2. FIGS. 4A and 4B are enlarged views of a portion 'PP1' of FIG. 3. FIG. 5 is a graph showing threshold voltage properties of a ferroelectric field-effect transistor according to some embodiments of the inventive concepts.

Referring to FIGS. 2 and 3, as well as FIG. 1, a plurality of first conductive lines 110 may be disposed on or in a substrate 100. The substrate 100 may include or may be a semiconductor substrate (e.g., a silicon (Si) substrate, a germanium (Ge) substrate, or a silicon-germanium (SiGe) substrate). The plurality of first conductive lines 110 may extend in the first direction D1 and may be spaced apart from each other in the second direction D2. The first direction D1 and the second direction D2 may be parallel to a top surface 100U of the substrate 100 and may intersect each other. The plurality of first conductive lines 110 may be buried in the substrate 100. The plurality of first conductive lines 110 may be formed of or may include a conductive material and may be formed of or include, for example, doped poly-silicon, a metal, a conductive metal nitride, a conductive metal silicide, a conductive metal oxide, or any combination thereof. For example, the plurality of first conductive lines 110 may be formed of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. However, embodiments of the inventive concepts are not limited thereto. In certain embodiments, the plurality of first conductive lines 110 may include or be formed of a two-dimensional semiconductor material.

For example, the two-dimensional semiconductor material may include or be graphene, carbon nanotube, or a combination thereof.

A buried insulating pattern 112 may be disposed between the substrate 100 and each of the plurality of first conductive lines 110. The buried insulating pattern 112 may be disposed between the substrate 100 and a bottom surface of each of the plurality of first conductive lines 110 and may extend between the substrate 100 and sidewalls of each of the plurality of first conductive lines 110. Each of the plurality of first conductive lines 110 may be spaced apart from the substrate 100 with the buried insulating pattern 112 interposed therebetween. The buried insulating pattern 112 may include or be formed of an insulating material (e.g., silicon oxide, silicon nitride, and/or silicon oxynitride).

A plurality of vertical semiconductor patterns VC may be disposed on the plurality of first conductive lines 110. The plurality of vertical semiconductor patterns VC may be two-dimensionally arranged (from a plan view) in the first direction D1 and the second direction D2 and may be spaced apart from each other in the first direction D1 and the second direction D2. The plurality of vertical semiconductor patterns VC may extend in the third direction D3 perpendicular to the top surface 100U of the substrate 100. Vertical semiconductor patterns VC (e.g., a set of vertical semiconductor patterns VC), spaced apart from each other in the first direction D1, of the plurality of vertical semiconductor patterns VC may be connected to a corresponding one of the plurality of first conductive lines 110. Vertical semiconductor patterns VC, spaced apart from each other in the second direction D2, of the plurality of vertical semiconductor patterns VC may be connected to the plurality of first conductive lines 110, respectively. Each of the plurality of first conductive lines 110 may be connected to corresponding vertical semiconductor patterns VC, spaced apart from each other in the first direction D1, of the plurality of vertical semiconductor patterns VC.

For example, the plurality of vertical semiconductor patterns VC may include or be formed of silicon, germanium, silicon-germanium, an oxide semiconductor, $MoS_2$, or $WS_2$. The oxide semiconductor may include or may be InGaZnO, InGaSiO, InSnZnO, InZnO, ZnO, ZnSnO, ZnON, ZrZnSnO, SnO, HfInZnO, GaZnSnO, AlZnSnO, YbGaZnO, InGaO, or any combination thereof. The plurality of vertical semiconductor patterns VC may include or be formed of, for example, poly-crystalline silicon. In certain embodiments, the plurality of vertical semiconductor patterns VC may include or be formed of a two-dimensional semiconductor material. For example, the two-dimensional semiconductor material may include or be graphene, carbon nanotube, or a combination thereof.

Each of the plurality of vertical semiconductor patterns VC may include a first dopant region 122A and a second dopant region 122B spaced apart from each other in the third direction D3, and a channel region 120 between the first dopant region 122A and the second dopant region 122B. The first dopant region 122A and the second dopant region 122B may include dopants having the same conductivity type. For example, the first dopant region 122A and the second dopant region 122B may include N-type dopants or P-type dopants. The first dopant regions 122A of the plurality of vertical semiconductor patterns VC may be adjacent to the plurality of first conductive lines 110 and may be connected to (e.g., directly connected to) the plurality of first conductive lines 110. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of connection or contact.

A plurality of gate structures GS may be disposed on the plurality of first conductive lines 110 and may cross the plurality of first conductive lines 110. The plurality of gate structures GS may be spaced apart from each other in the first direction D1 and may extend in the second direction D2. Each of the plurality of gate structures GS may penetrate corresponding vertical semiconductor patterns VC, spaced apart from each other in the second direction D2, of the plurality of vertical semiconductor patterns VC. Each of the plurality of gate structures GS may penetrate the channel regions 120 of the corresponding vertical semiconductor patterns VC. Each of the plurality of vertical semiconductor patterns VC may surround an outer surface GS_S of a corresponding gate structure GS of the plurality of gate structures GS. The channel region 120 of each of the plurality of vertical semiconductor patterns VC may surround the outer surface GS_S of the corresponding gate structure GS.

Each of the plurality of gate structures GS may include a gate electrode 130 extending in the second direction D2 to penetrate the corresponding vertical semiconductor patterns VC, a ferroelectric pattern 132 between the gate electrode 130 and each of the corresponding vertical semiconductor patterns VC, and a gate insulating pattern 134 between the ferroelectric pattern 132 and each of the corresponding vertical semiconductor patterns VC. The gate electrode 130 may include or be formed of doped poly-silicon, a metal, a conductive metal nitride, a conductive metal silicide, a conductive metal oxide, or any combination thereof. For example, the gate electrode 130 may be formed of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. However, embodiments of the inventive concepts are not limited thereto. The ferroelectric pattern 132 may include or be formed of a hafnium (Hf) compound having ferroelectric properties. For example, the ferroelectric pattern 132 may include or be formed of $HfO_2$, HfZnO, HfSiO, HfSiON, HfHaO, HfTiO, HfZrO, or any combination thereof. The ferroelectric pattern 132 may have an orthorhombic phase. The gate insulating pattern 134 may include or be formed of a silicon oxide layer, a silicon oxynitride layer, a high-k dielectric layer having a dielectric constant higher than that of a silicon oxide layer, or any combination thereof. The high-k dielectric layer may include or may be a metal oxide or a metal oxynitride.

The gate electrode 130 may be disposed inside each of the corresponding vertical semiconductor patterns VC, and each of the corresponding vertical semiconductor patterns VC may surround an outer surface 130S of the gate electrode 130. The ferroelectric pattern 132 may be disposed between the outer surface 130S of the gate electrode 130 and each of the corresponding vertical semiconductor patterns VC. The ferroelectric pattern 132 may surround the outer surface 130S of the gate electrode 130 and may extend in the second direction D2 along the gate electrode 130. The ferroelectric pattern 132 may be disposed inside each of the corresponding vertical semiconductor patterns VC, and each of the corresponding vertical semiconductor patterns VC may surround an outer surface 132S of the ferroelectric pattern 132. The gate insulating pattern 134 may be disposed between the outer surface 132S of the ferroelectric pattern 132 and each of the corresponding vertical semiconductor patterns VC. The gate insulating pattern 134 may surround the outer surface 132S of the ferroelectric pattern 132 and may extend in the second direction D2 along the gate electrode 130. The gate insulating pattern 134 may be disposed inside each of the corresponding vertical semiconductor patterns VC, and each of the corresponding vertical semiconductor patterns VC may surround, and may contact, an outer surface 134S of the gate insulating pattern 134. The gate electrode 130, the ferroelectric pattern 132 and the gate insulating pattern 134 may be disposed in the channel region 120 of each of the corresponding vertical semiconductor patterns VC, and the channel region 120 of each of the corresponding vertical semiconductor patterns VC may surround the outer surfaces 130S, 132S and 134S of the gate electrode 130, the ferroelectric pattern 132 and the gate insulating pattern 134. The outer surface GS_S of each of the plurality of gate structures GS may correspond to the outer surface 134S of the gate insulating pattern 134.

In some embodiments, the outer surface 130S of the gate electrode 130 may have a rounded shape when viewed in a cross-sectional view. For example, the gate electrode 130 may have a cylindrical shape. Each of the ferroelectric pattern 132 and the gate insulating pattern 134 may have a rounded ring shape surrounding the outer surface 130S of the gate electrode 130 when viewed in a cross-sectional view. The outer surface GS_S of each of the plurality of gate structures GS may have a rounded shape when viewed in a cross-sectional view. For example, each of the plurality of gate structures GS may have a cylindrical shape.

Support patterns 160 may be disposed on the substrate 100 and may support the plurality of gate structures GS. The support patterns 160 may be spaced apart from each other in the second direction D2 with the plurality of gate structures GS interposed therebetween and may extend in the first direction D1. One of the support patterns 160 may be in contact with end portions (e.g., first end portions) of the plurality of gate structures GS, and another of the support patterns 160 (e.g., a next adjacent support pattern 160) may be in contact with other end portions (e.g., second end portions opposite the first end portions) of the plurality of gate structures GS. Each of the support patterns 160 may include a first insulating pattern 162, a sacrificial pattern 164 and a second insulating pattern 166, which are sequentially stacked on the substrate 100 in the third direction D3. The sacrificial pattern 164 may include or be formed of a material having an etch selectivity with respect to the first and second insulating patterns 162 and 166. For example, the sacrificial pattern 164 may include or be formed of silicon nitride, and the first and second insulating patterns 162 and 166 may include or be formed of silicon oxide. The sacrificial pattern 164 of one of the support patterns 160 (e.g., a first support pattern 160) may be in contact with first end portions of the plurality of gate structures GS, and the sacrificial pattern 164 of the other of the support patterns 160 (e.g., a second support pattern 160) may be in contact with the second end portions of the plurality of gate structures GS opposite the first end portions. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

An interlayer insulating layer 140 may be disposed on the substrate 100 and may cover the plurality of first conductive lines 110, the plurality of vertical semiconductor patterns VC, and the plurality of gate structures GS. The interlayer insulating layer 140 may fill a space between the substrate 100 and the plurality of gate structures GS and between the plurality of vertical semiconductor patterns VC. The interlayer insulating layer 140 may not cover top surfaces of the plurality of vertical semiconductor patterns VC, thereby leaving those top surfaces exposed with respect to the interlayer insulating layer 140. For example, the interlayer insulating layer 140 may include or may be formed of at least one of silicon oxide, silicon nitride, or silicon oxynitride.

A plurality of second conductive lines 150 may be disposed on the interlayer insulating layer 140 and the plurality of vertical semiconductor patterns VC. The plurality of second conductive lines 150 may cross the plurality of gate structures GS. The plurality of second conductive lines 150 may extend in the first direction D1 and may be spaced apart from each other in the second direction D2. The vertical semiconductor patterns VC (e.g., a set of vertical semiconductor patterns VC), spaced apart from each other in the first direction D1, of the plurality of vertical semiconductor patterns VC may be connected to a corresponding one of the plurality of second conductive lines 150. The vertical semiconductor patterns VC, spaced apart from each other in the second direction D2, of the plurality of vertical semiconductor patterns VC may be connected to the plurality of second conductive lines 150, respectively. Each of the plurality of second conductive lines 150 may be connected to corresponding vertical semiconductor patterns VC, spaced apart from each other in the first direction D1, of the plurality of vertical semiconductor patterns VC. The second dopant regions 122B of the plurality of vertical semiconductor patterns VC may be adjacent to the plurality of second conductive lines 150 and may be connected to and may contact the plurality of second conductive lines 150. The plurality of second conductive lines 150 may include or be formed of a conductive material and may include or be formed of, for example, doped poly-silicon, a metal, a conductive metal nitride, a conductive metal silicide, a conductive metal oxide, or any combination thereof. For example, the plurality of second conductive lines 150 may be formed of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. However, embodiments of the inventive concepts are not limited thereto. In certain embodiments, the plurality of second conductive lines 150 may include or be formed of a two-dimensional semiconductor material. For example, the two-dimensional semiconductor material may include or may be graphene, carbon nanotube, or a combination thereof.

In some embodiments, the plurality of first conductive lines 110 may function as bit lines, and the plurality of second conductive lines 150 may function as source lines. In certain embodiments, the plurality of first conductive lines 110 may function as source lines, and the plurality of second conductive lines 150 may function as bit lines.

Referring to FIGS. 4A, 4B and 5, each of the plurality of vertical semiconductor patterns VC and a corresponding gate structure GS penetrating therethrough may constitute a ferroelectric field-effect transistor. Hereinafter, an operating principle of an N-type ferroelectric field-effect transistor will be described as an example for the purpose of ease and convenience in explanation. However, embodiments of the inventive concepts are not limited thereto. For example, referring to FIGS. 4A and 5, when a positive voltage is applied to the gate electrode 130 ($V_G$>0), a polarity Pr of the ferroelectric pattern 132 may be in a positive (+) direction. Thus, a channel may be formed in the channel region 120, and a current ID may flow between the first and second dopant regions 122A and 122B. In this case, the ferroelectric field-effect transistor may have a first threshold voltage $V_{TH1}$ which is relatively small, and may be in an on-state. Even after the positive voltage applied to the gate electrode 130 is interrupted, the ferroelectric field-effect transistor may be maintained in the on-state due to a remaining polarity +Pr of the ferroelectric pattern 132. Referring to FIGS. 4B and 5, when a negative voltage is applied to the gate electrode 130 ($V_G$<0), the direction of the polarity Pr of the ferroelectric pattern 132 may be reversed to a negative (−) direction. In this case, the ferroelectric field-effect transistor may have a second threshold voltage $V_{TH2}$ greater than the first threshold voltage Vim and may be in an off-state. Even though a voltage applied to the gate electrode 130 increases to 0V, the ferroelectric field-effect transistor may be maintained in the off-state due to a remaining reversed polarity −Pr of the ferroelectric pattern 132. Thus, according to the embodiments of the inventive concepts, a non-volatile semiconductor memory device including the ferroelectric field-effect transistor may be provided.

According to the embodiments of the inventive concepts, the plurality of vertical semiconductor patterns VC may be two-dimensionally arranged in the first direction D1 and the second direction D2 on the substrate 100, and each of the plurality of gate structures GS may penetrate corresponding vertical semiconductor patterns VC, spaced apart from each other in the second direction D2, of the plurality of vertical semiconductor patterns VC. Each of the plurality of gate structures GS may be disposed inside the corresponding vertical semiconductor patterns VC, and thus it is possible to prevent disturbance between the gate structures GS adjacent to each other. In addition, since each of the plurality of gate structures GS is disposed inside the corresponding vertical semiconductor patterns VC, it may be easy to reduce a size of a memory cell structure including the plurality of gate structures GS and the plurality of vertical semiconductor patterns VC. Thus, an integration density of the semiconductor device may be easily improved.

Furthermore, each of the plurality of gate structures GS may include the gate electrode 130, the ferroelectric pattern 132 surrounding, and contacting, the outer surface 130S of the gate electrode 130, and the gate insulating pattern 134 surrounding, and contacting, the outer surface 132S of the ferroelectric pattern 132. Since the ferroelectric pattern 132 surrounds the outer surface 130S of the gate electrode 130, an intensity of an electric field applied to the ferroelectric pattern 132 may be increased, and an intensity of an electric field applied to the gate insulating pattern 134 may be reduced. Thus, polarity properties of the ferroelectric pattern 132 may be improved, and endurance of the gate insulating pattern 134 may be improved. As a result, operating characteristics and reliability of the semiconductor device may be improved.

FIGS. 6, 8, 10, 12, 14, 16, 18 and 20 are plan views illustrating a method of manufacturing a semiconductor device according to some embodiments of the inventive concepts. FIGS. 7, 9, 11, 13, 15, 17, 19 and 21 are cross-sectional views taken along lines A-A' and B-B' of FIGS. 6, 8, 10, 12, 14, 16, 18 and 20, respectively. Hereinafter, the descriptions to the same technical features as described with reference to FIGS. 1 to 5 will be omitted or mentioned briefly for the purpose of ease and convenience in explanation.

Figure 6:
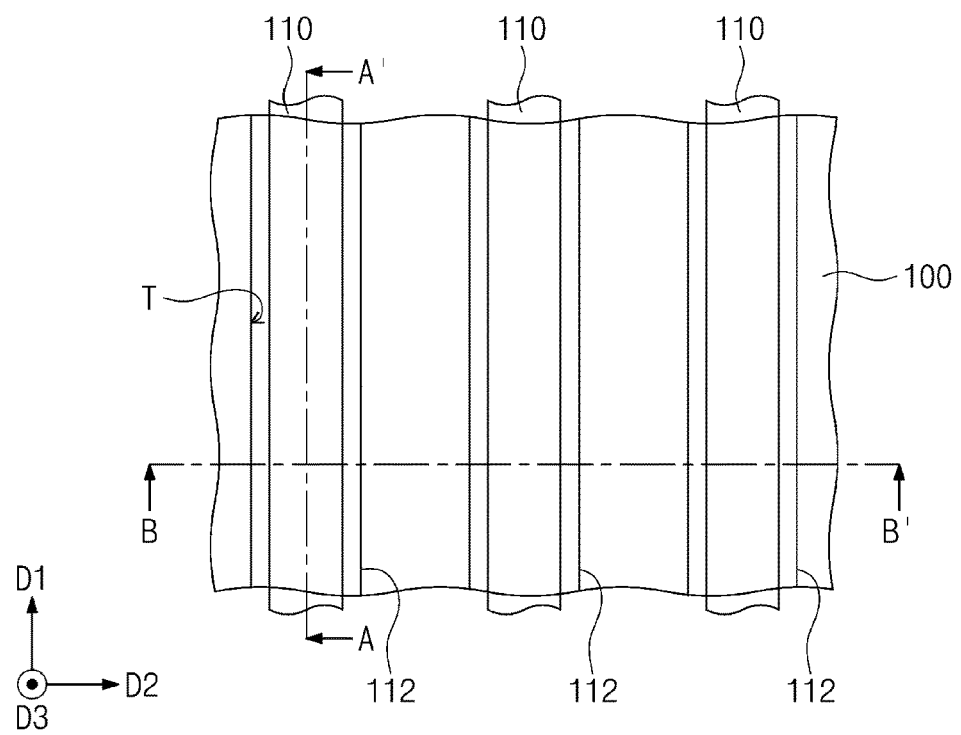
FIGS. 6, 8, 10, 12, 14, 16, 18 and 20 are plan views illustrating a method of manufacturing a semiconductor device according to some embodiments of the inventive concepts.
Figure 7:
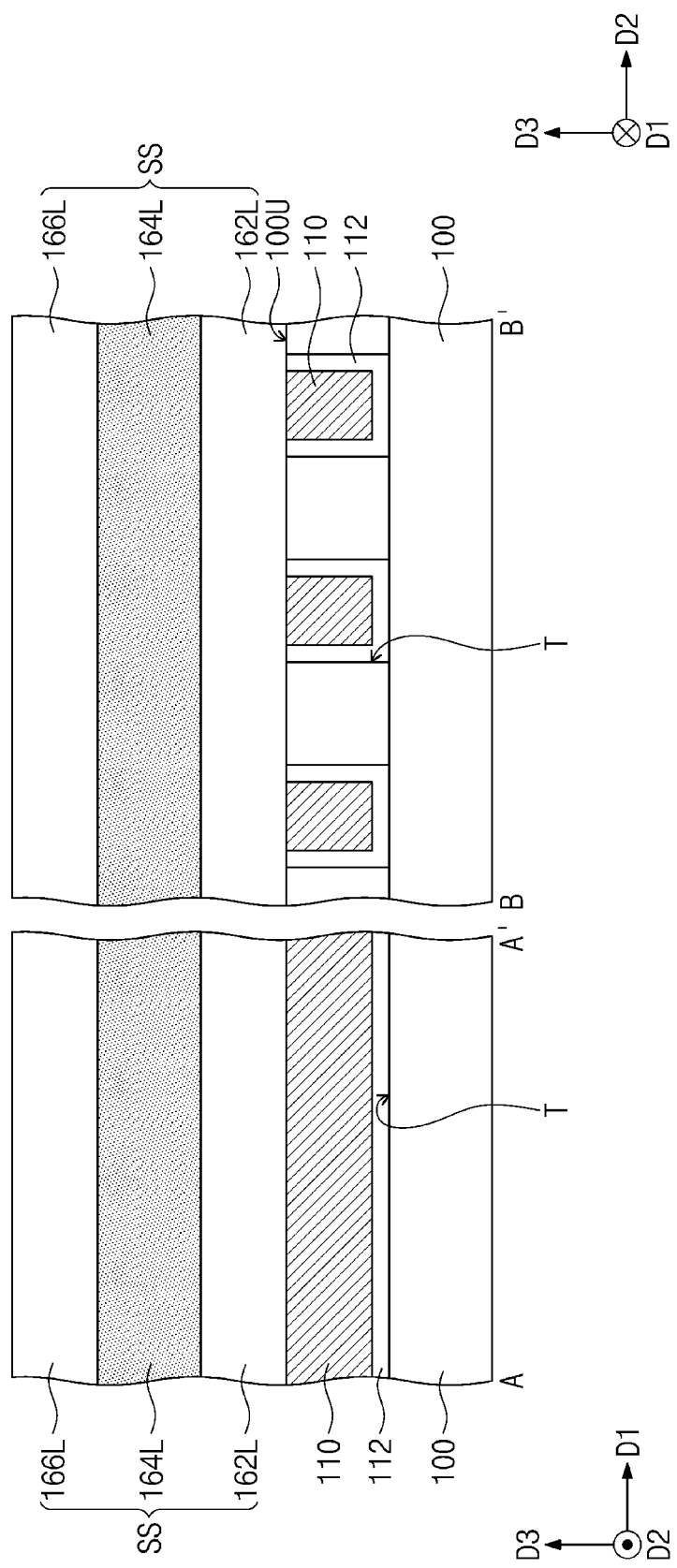
FIGS. 7, 9, 11, 13, 15, 17, 19 and 21 are cross-sectional views taken along lines A-A' and B-B' of FIGS. 6, 8, 10, 12, 14, 16, 18 and 20, respectively.

Referring to FIGS. 6 and 7, a plurality of first conductive lines 110 may be formed in a substrate 100, and a buried insulating pattern 112 may be formed between the substrate 100 and each of the plurality of first conductive lines 110. The plurality of first conductive lines 110 may extend in the first direction D1 and may be spaced apart from each other in the second direction D2. For example, the formation of the plurality of first conductive lines 110 and the buried insulating pattern 112 may include forming a plurality of trenches T by etching an upper portion of the substrate 100, forming a buried insulating layer filling a portion of each of the plurality of trenches T on the substrate 100, forming a first conductive layer filling a remaining portion of each of the plurality of trenches T on the buried insulating layer, and planarizing the first conductive layer and the buried insulating layer until a top surface 100U of the substrate 100 is exposed. Each of the plurality of trenches T may have a line shape (e.g., straight line shape) extending in the first direction D1, and the plurality of trenches T may be spaced apart from each other in the second direction D2. The plurality of first conductive lines 110 and the buried insulating patterns 112 may be locally formed in the plurality of trenches T by the planarization of the first conductive layer and the buried insulating layer.

A stack layer SS may be formed on the substrate 100 and may cover the plurality of first conductive lines 110 and the buried insulating patterns 112. The stack layer SS may include a first insulating layer 162L, a sacrificial layer 164L and a second insulating layer 166L, which are sequentially stacked in the third direction D3. The sacrificial layer 164L may include a material having an etch selectivity with respect to the first and second insulating layers 162L and 166L. For example, the first and second insulating layers 162L and 166L may include or be formed of silicon oxide, and the sacrificial layer 164L may include or be formed of silicon nitride.

Figure 8:
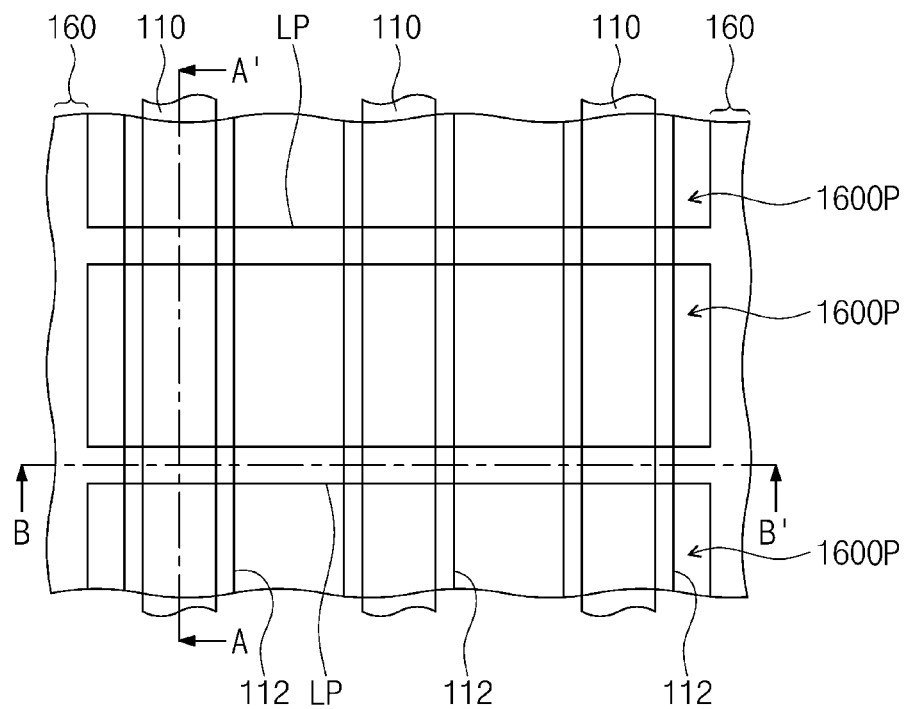
Figure 8:
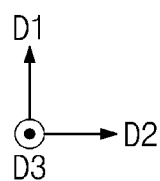
Figure 9:
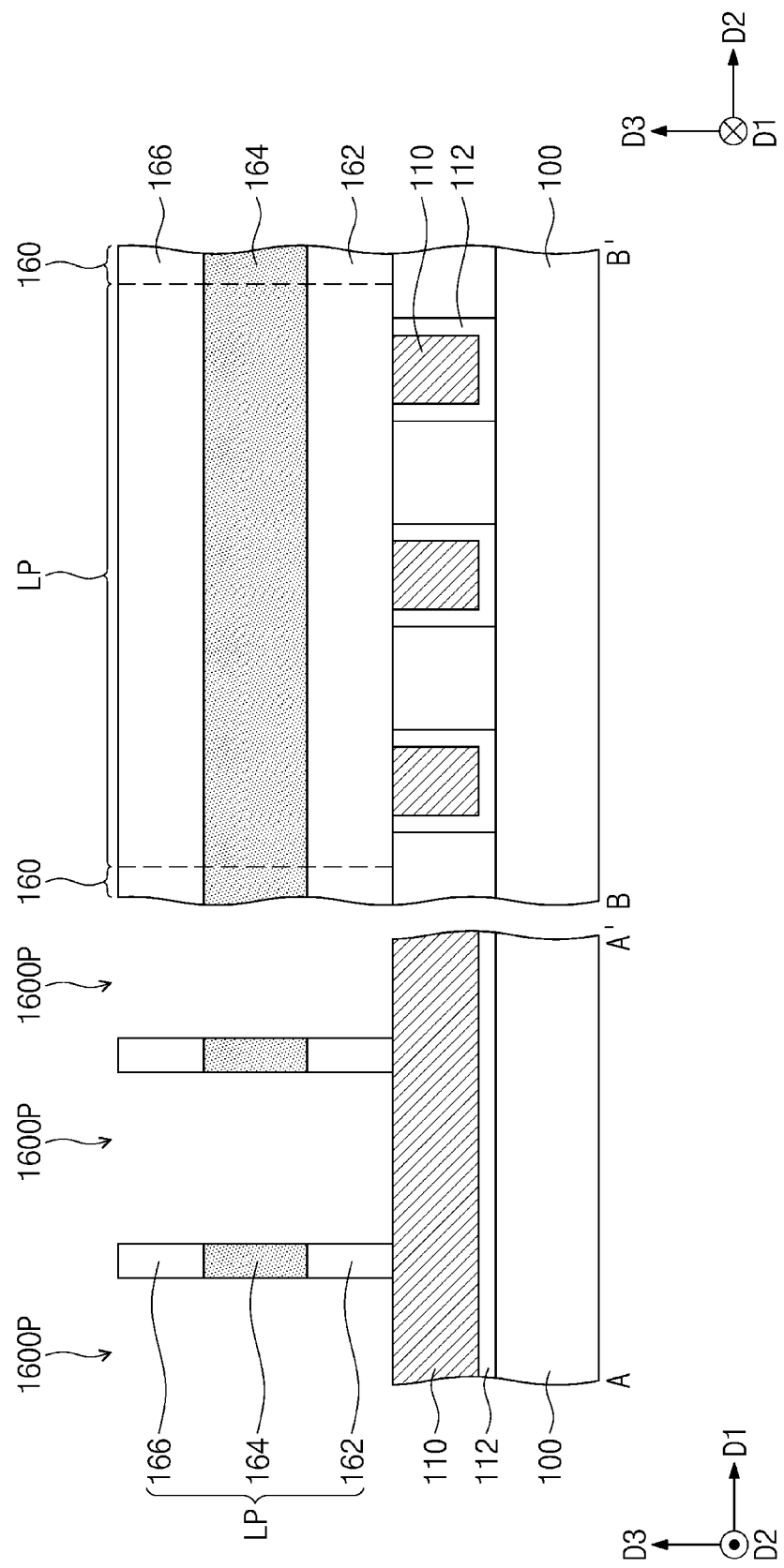

Referring to FIGS. 8 and 9, a plurality of openings 160OP may be formed in the stack layer SS. Each of the plurality of openings 160OP may have a line shape extending in the second direction D2, and the plurality of openings 160OP may be spaced apart from each other in the first direction D1. Each of the plurality of openings 160OP may cross the plurality of first conductive lines 110 and may expose portions of the plurality of first conductive lines 110. For example, the formation of the plurality of openings 160OP may include forming a first mask pattern defining the plurality of openings 160OP on the stack layer SS, sequentially etching the second insulating layer 166L, the sacrificial layer 164L and the first insulating layer 162L by using the first mask pattern as an etch mask, and removing the first mask pattern.

Since the plurality of openings 160OP is formed in the stack layer SS, line patterns LP may be formed between the plurality of openings 160OP, and support patterns 160 may be formed at both sides of each of the plurality of openings 160OP, respectively. The line patterns LP may extend in the second direction D2 and may be spaced apart from each other in the first direction D1. The support patterns 160 may be spaced apart from each other in the second direction D2 with the line patterns LP interposed therebetween and may extend in the first direction D1. One of the support patterns 160 may be connected to end portions of the line patterns LP, and the other of the support patterns 160 may be connected to other end portions of the line patterns LP. The support patterns 160 and the line patterns LP may be connected to each other to constitute one body (e.g., one continuous, integrated structure). Each of the support patterns 160 and the line patterns LP may include a first insulating pattern 162, a sacrificial pattern 164 and a second insulating pattern 166, which are sequentially stacked on the substrate 100 in the third direction D3. The first insulating pattern 162, the sacrificial pattern 164 and the second insulating pattern 166 may be formed by etching the first insulating layer 162L, the sacrificial layer 164L and the second insulating layer 166L, respectively.

Figure 10:
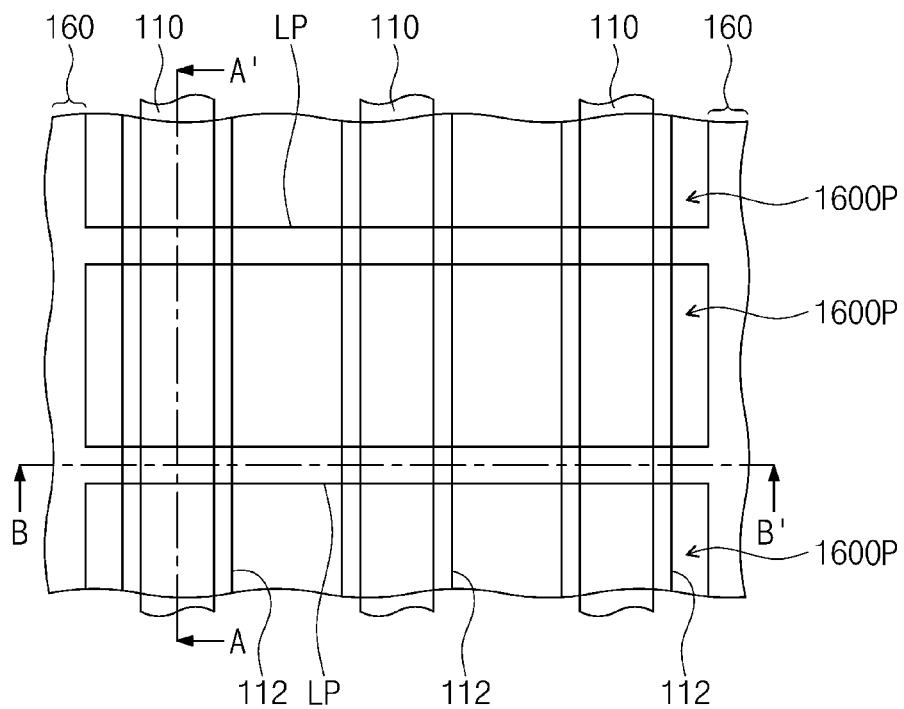
Figure 10:
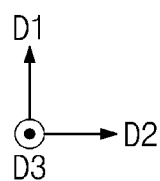
Figure 11:
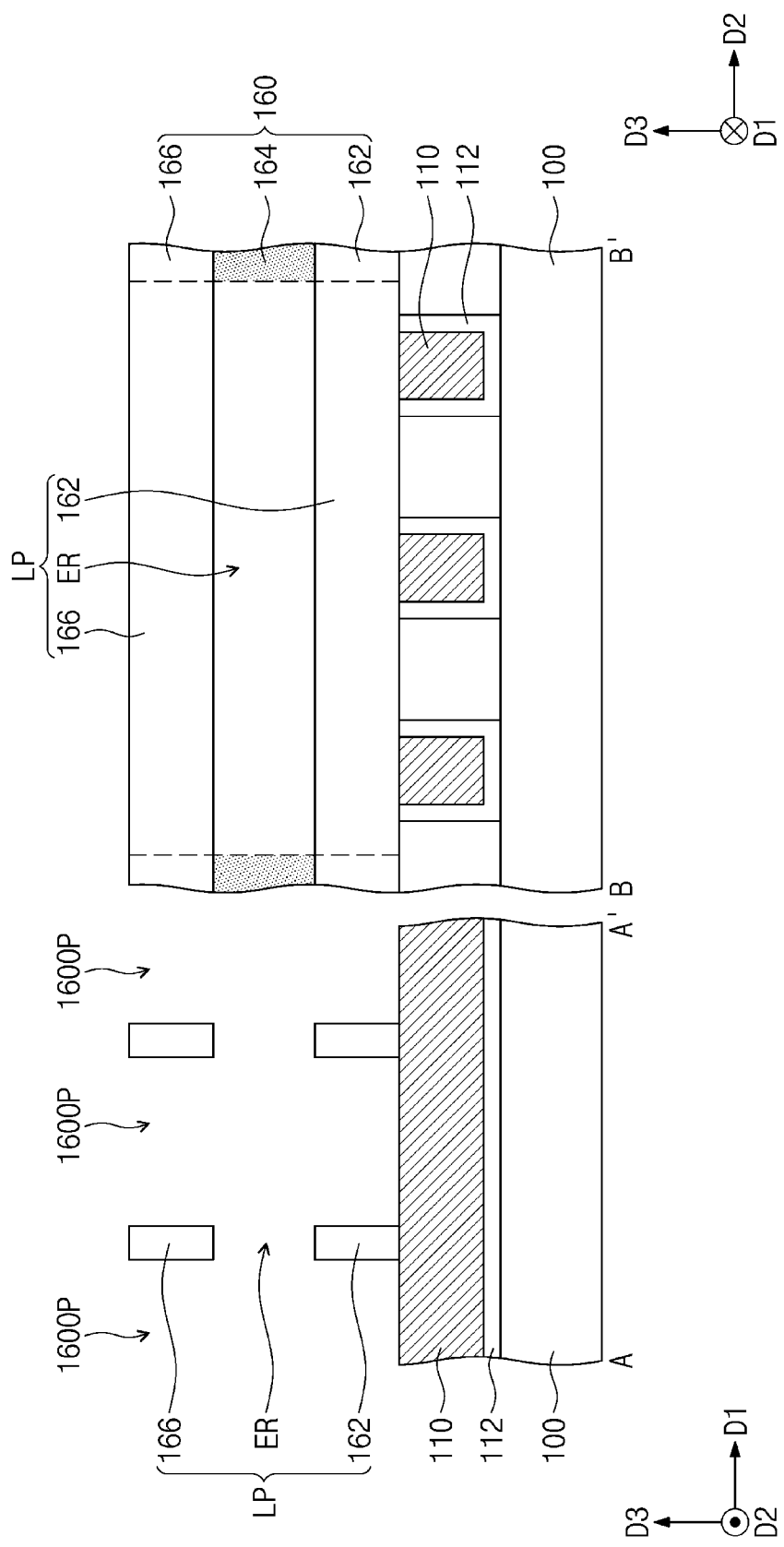

Referring to FIGS. 10 and 11, the sacrificial pattern 164 of each of the line patterns LP may be removed, and thus an empty region ER may be formed in each of the line patterns LP. The empty region ER may be formed between the first insulating pattern 162 and the second insulating pattern 166 of each of the line patterns LP. The empty region ER may have a line shape extending in the second direction D2. The empty regions ER in the line patterns LP may be spaced apart from each other in the first direction D1. The removal of the sacrificial pattern 164 of each of the line patterns LP may include performing a selective etching process (e.g., a wet etching process) having an etch selectivity with respect to the sacrificial pattern 164. The first insulating pattern 162 and the second insulating pattern 166 of each of the line patterns LP may not be removed by the selective etching process.

During the removal of the sacrificial pattern 164 of each of the line patterns LP, the sacrificial pattern 164 of each of the support patterns 160 may not be completely removed but may remain. The sacrificial pattern 164 of the one of the support patterns 160 may extend in the first direction D1 and may be exposed by end portions of the empty regions ER of the line patterns LP. The sacrificial pattern 164 of the other of the support patterns 160 may be exposed by other end portions of the empty regions ER of the line patterns LP. The first insulating pattern 162 and the second insulating pattern 166 of each of the support patterns 160 may not be removed by the selective etching process.

Figure 12:
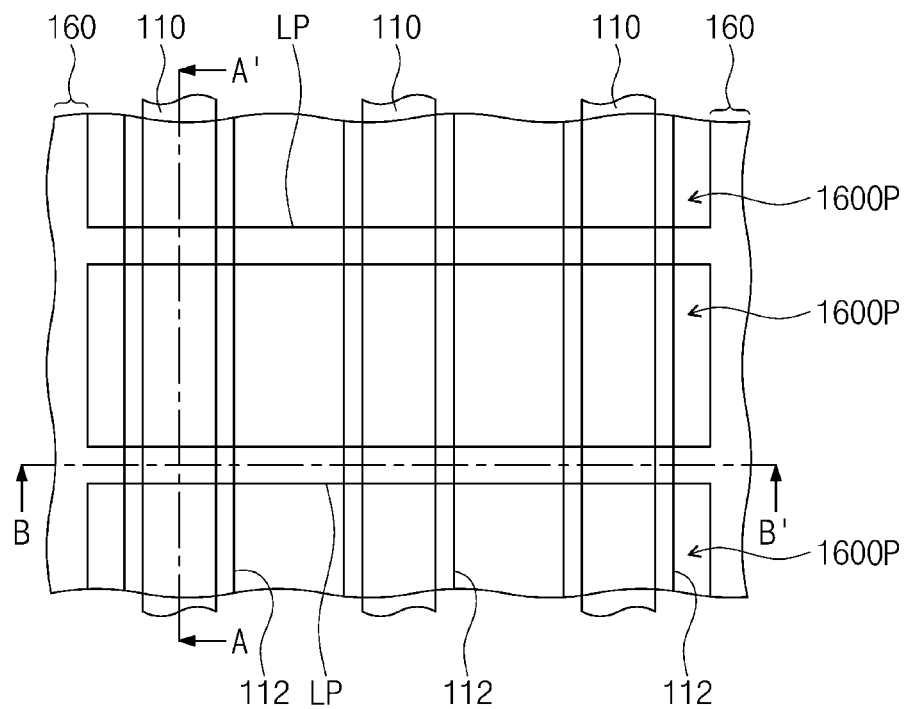
Figure 12:
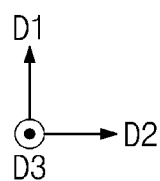
Figure 13:
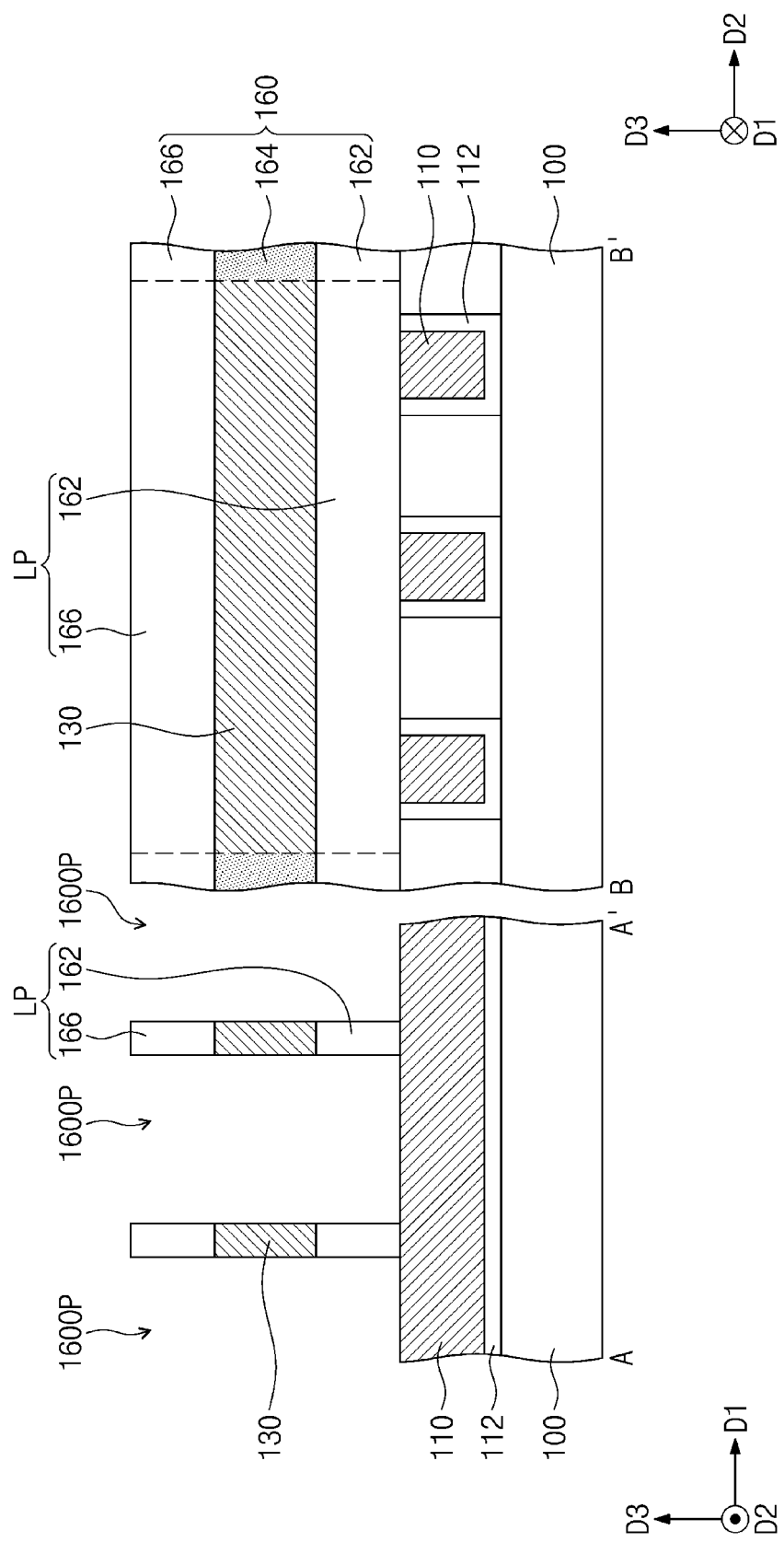

Referring to FIGS. 12 and 13, a gate electrode 130 may be formed in the empty region ER of each of the line patterns LP. The gate electrode 130 may have a line shape extending in the second direction D2, and the gate electrodes 130 in the line patterns LP may be spaced apart from each other in the first direction D1. For example, the formation of the gate electrode 130 may include forming a gate electrode layer filling the empty region ER of each of the line patterns LP and filling at least a portion of each of the plurality of openings 160OP, and removing a remaining portion of the gate electrode layer in the plurality of openings 160OP. The remaining portion of the gate electrode layer in the plurality of openings 160OP may be removed by, for example, an anisotropic etching process. The gate electrode 130 may be locally formed in the empty region ER by the removal of the remaining portion of the gate electrode layer in the plurality of openings 160OP.

The support patterns 160 may be spaced apart from each other in the second direction D2 with the gate electrode 130 interposed therebetween. The sacrificial pattern 164 of the one of the support patterns 160 may be in contact with an end portion of the gate electrode 130, and the sacrificial pattern 164 of the other of the support patterns 160 may be in contact with another end portion of the gate electrode 130. The support patterns 160 may support the gate electrode 130 in subsequent processes.

Figure 14:
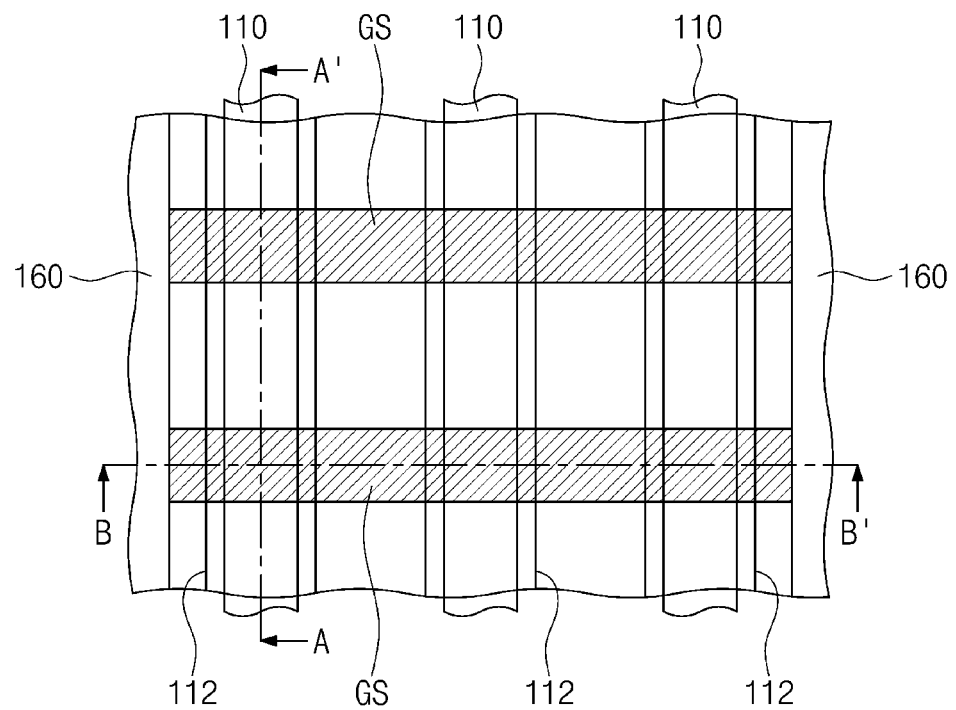
Figure 15:
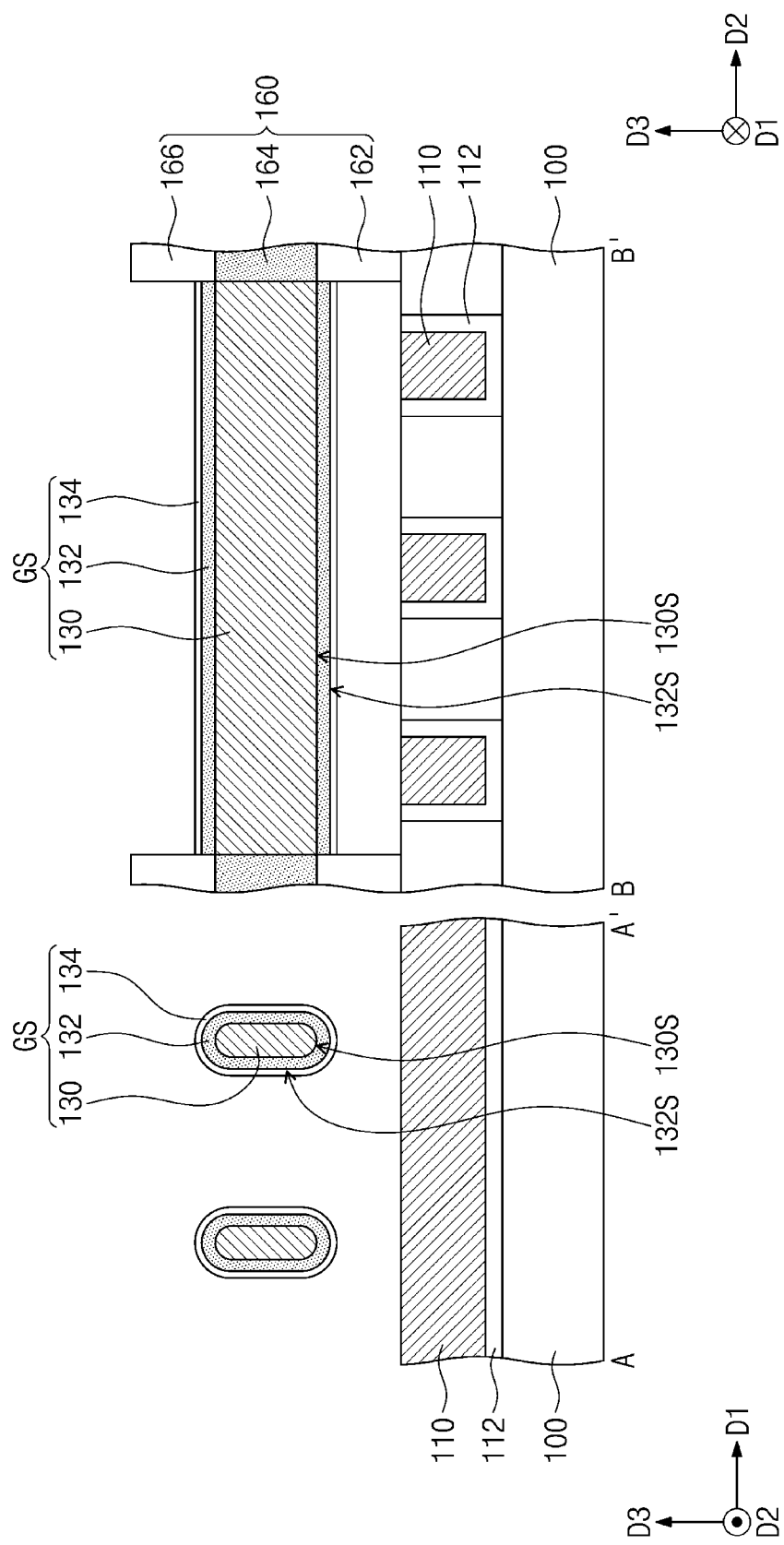

Referring to FIGS. 14 and 15, the first insulating pattern 162 and the second insulating pattern 166 of each of the line patterns LP may be removed. For example, the removal of the first insulating pattern 162 and the second insulating pattern 166 of each of the line patterns LP may include forming a second mask pattern covering the support patterns 160 but exposing the line patterns LP, etching (dry or wet-etching) the first insulating pattern 162 and the second insulating pattern 166 of each of the line patterns LP by using the second mask pattern as an etch mask, and removing the second mask pattern. During the removal of the first insulating pattern 162 and the second insulating pattern 166 of each of the line patterns LP, the support patterns 160 support the gate electrode 130.

An outer surface 130S of the gate electrode 130 may be exposed by the removal of the first insulating pattern 162 and the second insulating pattern 166 of each of the line patterns LP. In some embodiments, the outer surface 130S of the gate electrode 130 may have a rounded shape when viewed in a cross-sectional view. The rounded shape of the outer surface 130S of the gate electrode 130 may be formed by performing an additional etching process (i.e., an additional dry or wet etching process) on the outer surface 130S of the gate electrode 130. In certain embodiments, the additional etching process may be omitted. In this case, the outer surface 130S of the gate electrode 130 may have an angular shape when viewed in a cross-sectional view. Thereafter, a ferroelectric pattern 132 may be formed to surround the outer surface 130S of the gate electrode 130, and a gate insulating pattern 134 may be formed to surround an outer surface 132S of the ferroelectric pattern 132. For example, the ferroelectric pattern 132 and the gate insulating pattern 134 may be formed by selective deposition methods performed on the gate electrode 130.

The gate electrode 130, the ferroelectric pattern 132 and the gate insulating pattern 134 may constitute a gate structure GS. The gate structure GS may have a line shape extending in the second direction D2, and a plurality of the gate structures GS may be spaced apart from each other in the first direction D1. The plurality of gate structures GS may cross the plurality of first conductive lines 110. The support patterns 160 may be spaced apart from each other in the second direction D2 with the plurality of gate structures GS interposed therebetween. One of the support patterns 160 may be in contact with end portions of the plurality of gate structures GS, and the other of the support patterns 160 may be in contact with other end portions of the plurality of gate structures GS. The support patterns 160 may support the plurality of gate structures GS.

Figure 16:
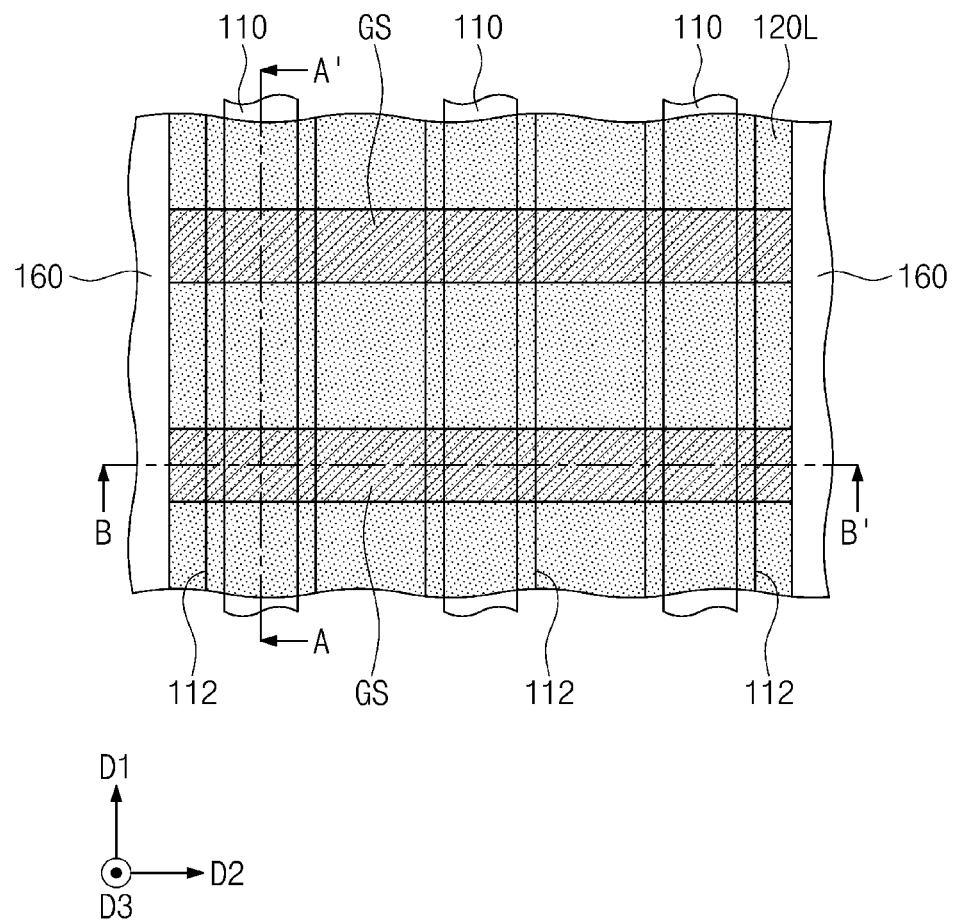
Figure 17:
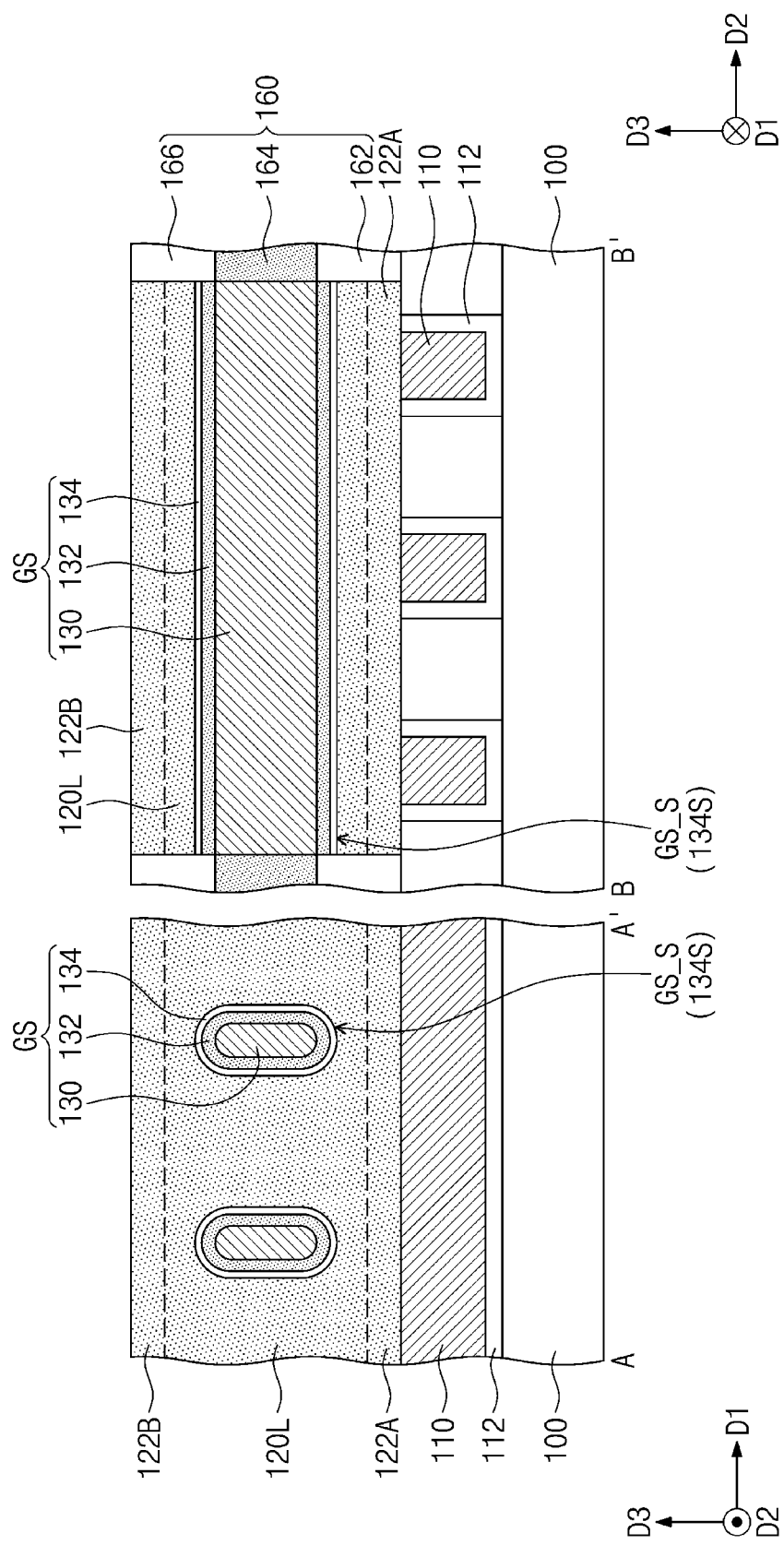

Referring to FIGS. 16 and 17, a semiconductor layer 120L may be formed on the substrate 100 to cover the plurality of gate structures GS. The semiconductor layer 120L may surround an outer surface GS_S of each of the plurality of gate structures GS, and the outer surface GS_S of each of the plurality of gate structures GS may correspond to an outer surface 134S of the gate insulating pattern 134. The semiconductor layer 120L may fill a space between the plurality of first conductive lines 110 and the plurality of gate structures GS, between the substrate 100 and the plurality of gate structures GS and between the support patterns 160. The semiconductor layer 120L may be formed by, for example, a chemical vapor deposition (CVD) method.

In the formation of the semiconductor layer 120L, a first dopant region 122A may be formed in a lower portion of the semiconductor layer 120L, and a second dopant region 122B may be formed in an upper portion of the semiconductor layer 120L. The first dopant region 122A may be adjacent to (e.g., directly adjacent to) the substrate 100 and the plurality of first conductive lines 110. For example, the formation of the first and second dopant regions 122A and 122B may include injecting dopants into the semiconductor layer 120L in the formation of the semiconductor layer 120L.

Figure 18:
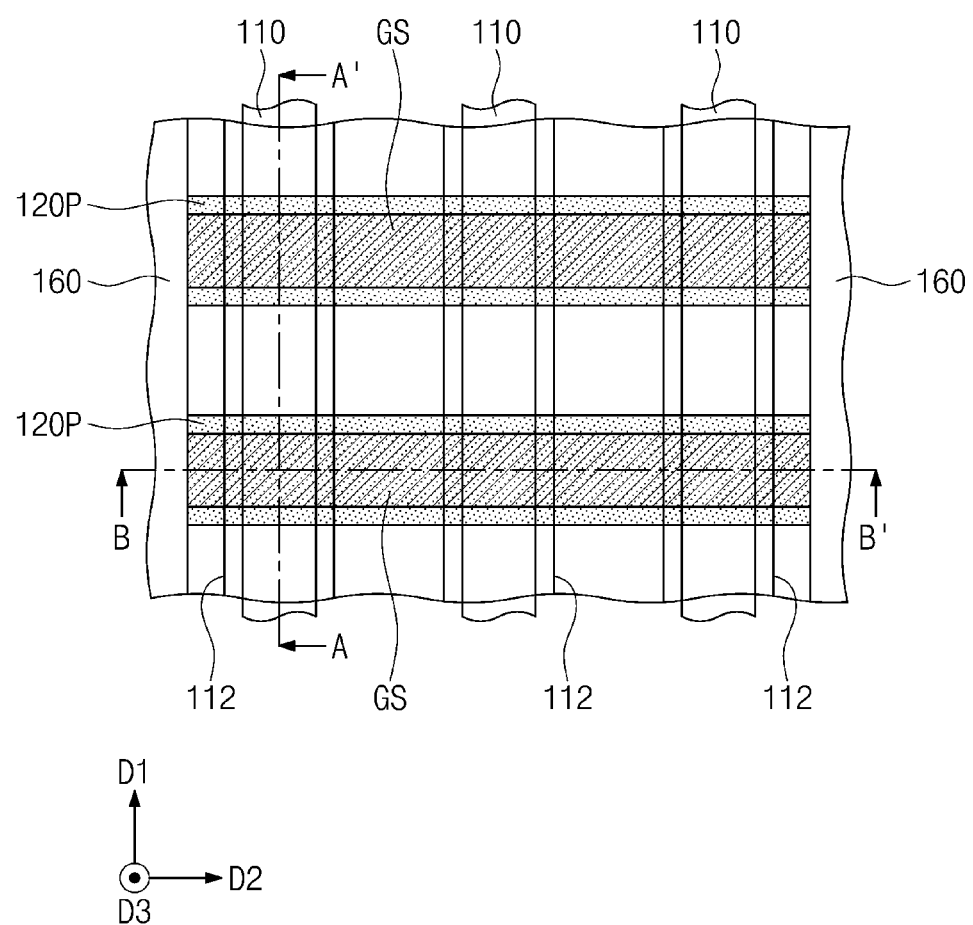
Figure 19:
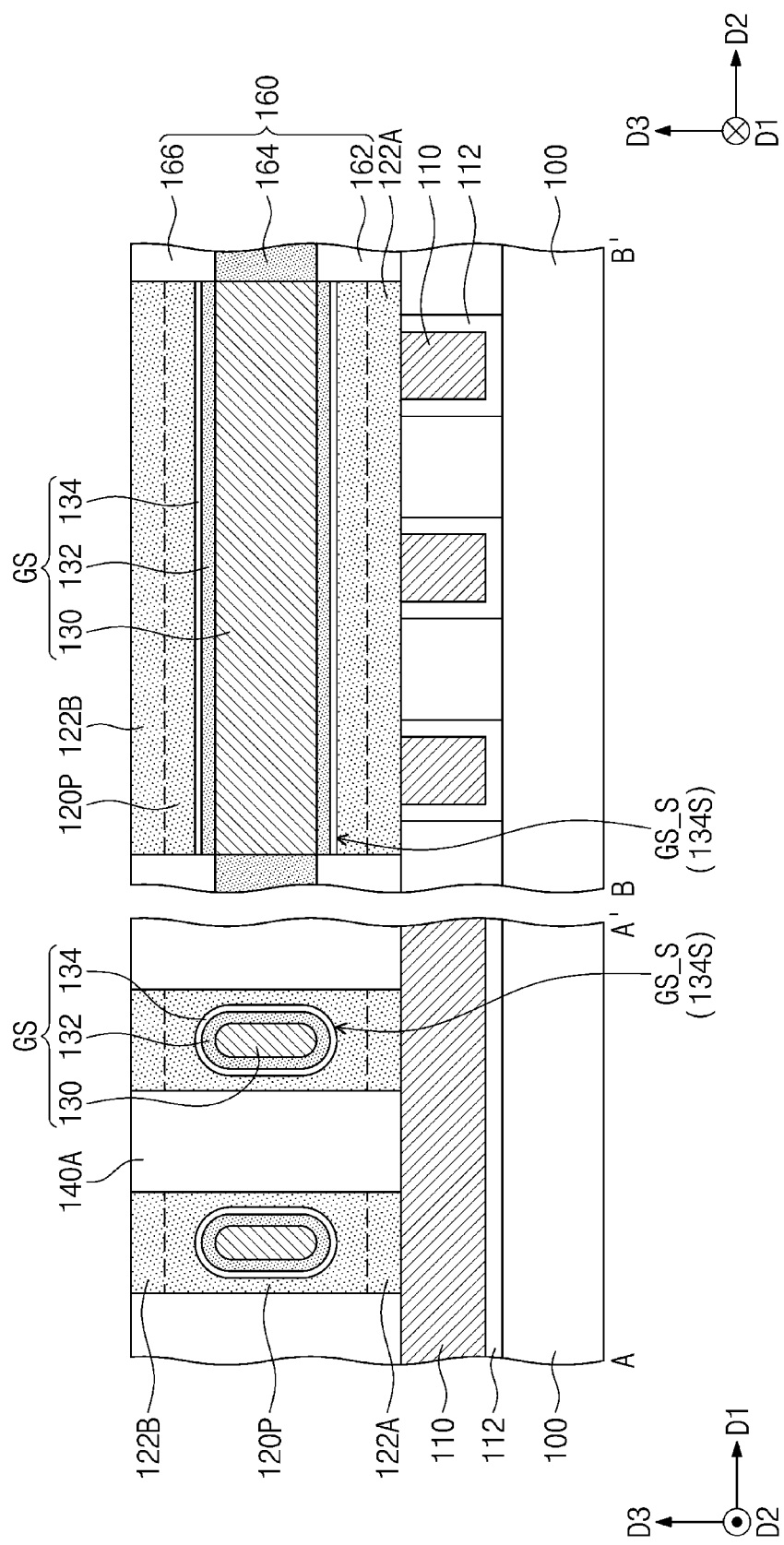

Referring to FIGS. 18 and 19, preliminary semiconductor patterns 120P may be formed to intersect the plurality of first conductive lines 110. The preliminary semiconductor patterns 120P may extend in the second direction D2 and may be spaced apart from each other in the first direction D1. The preliminary semiconductor patterns 120P may overlap with the gate structures GS, respectively. The gate structures GS may be disposed in the preliminary semiconductor patterns 120P, respectively, and each of the preliminary semiconductor patterns 120P may surround the outer surface GS_S of each of the plurality of gate structures GS. The preliminary semiconductor patterns 120P may be formed by patterning the semiconductor layer 120L. The first dopant region 122A may be disposed in a lower portion of each of the preliminary semiconductor patterns 120P, and the second dopant region 122B may be disposed in an upper portion of each of the preliminary semiconductor patterns 120P.

A first interlayer insulating layer 140A may be formed to fill a space between the preliminary semiconductor patterns 120P. The first interlayer insulating layer 140A may cover sidewalls of the preliminary semiconductor patterns 120P and may expose top surfaces of the preliminary semiconductor patterns 120P. For example, the first interlayer insulating layer 140A may be or may include at least one of silicon oxide, silicon nitride, or silicon oxynitride.

Figure 20:
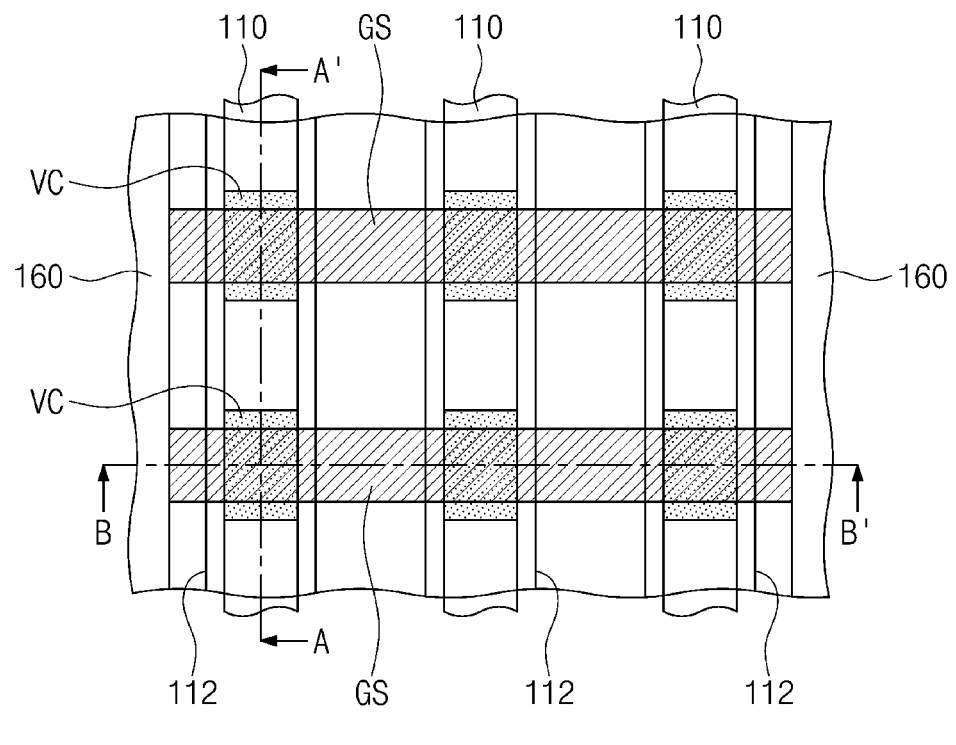
Figure 21:
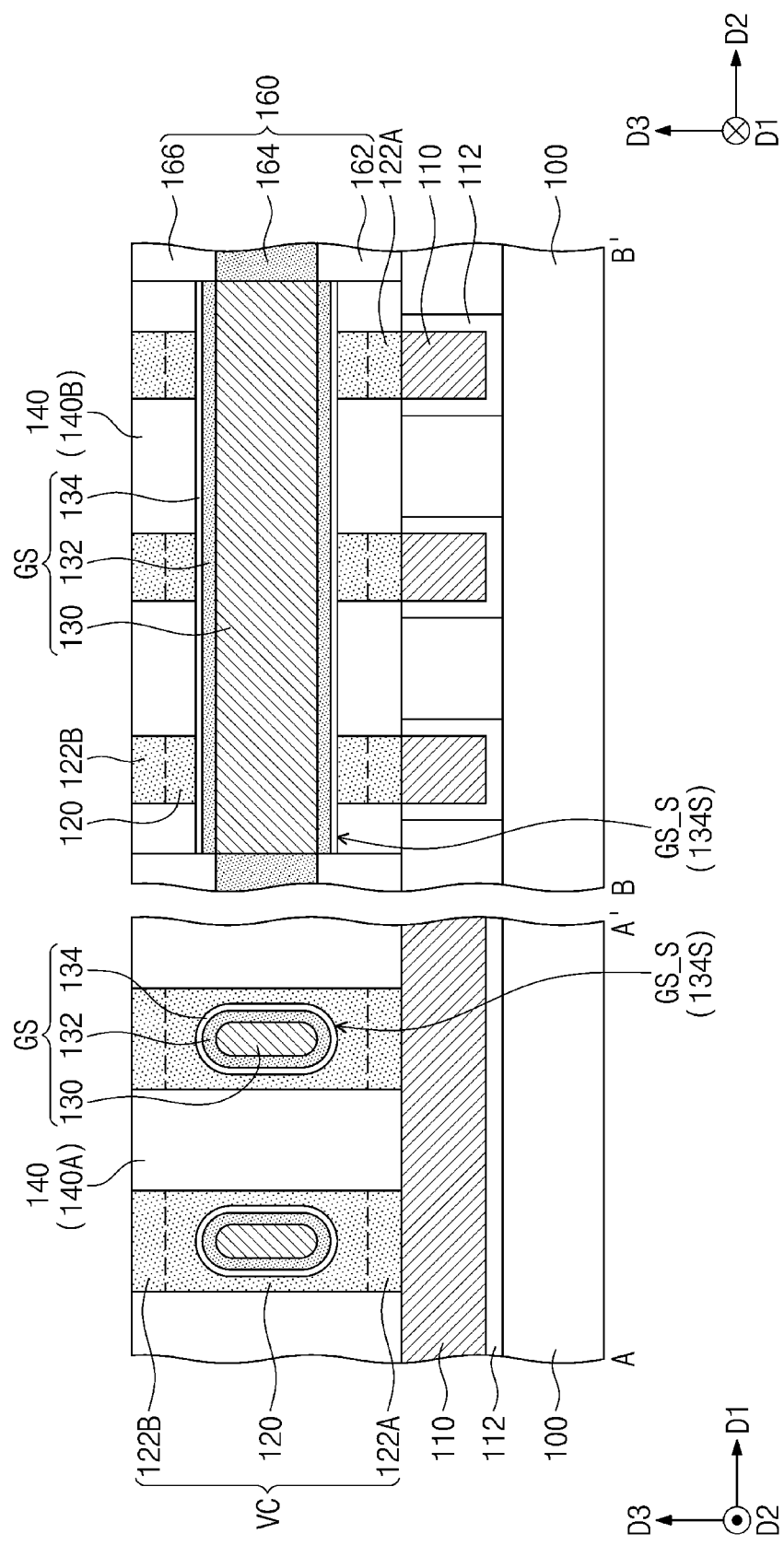

Referring to FIGS. 20 and 21, a plurality of vertical semiconductor patterns VC may be formed by patterning the preliminary semiconductor patterns 120P. The plurality of vertical semiconductor patterns VC may be spaced apart from each other in the first direction D1 and the second direction D2. Each of the preliminary semiconductor patterns 120P may be etched by a dry or wet etching process and thus may be divided into the vertical semiconductor patterns VC spaced apart from each other in the second direction D2. Each of the plurality of vertical semiconductor patterns VC may include the first dopant region 122A and the second dopant region 122B spaced apart from each other in the third direction D3, and a channel region 120 between the first dopant region 122A and the second dopant region 122B. A second interlayer insulating layer 140B may be formed to fill a space between the vertical semiconductor patterns VC spaced apart from each other in the second direction D2. For example, the second interlayer insulating layer 140B may include or may be formed of at least one of silicon oxide, silicon nitride, or silicon oxynitride. The first interlayer insulating layer 140A and the second interlayer insulating layer 140B may be referred to as an interlayer insulating layer 140. The interlayer insulating layer 140 may not cover top surfaces of the plurality of vertical semiconductor patterns VC, and thus the top surfaces of the plurality of vertical semiconductor patterns VC may be exposed with respect to the interlayer insulating layer 140.

Vertical semiconductor patterns VC, spaced apart from each other in the first direction D1, of the plurality of vertical semiconductor patterns VC may be connected to a corresponding one of the plurality of first conductive lines 110. Vertical semiconductor patterns VC, spaced apart from each other in the second direction D2, of the plurality of vertical semiconductor patterns VC may be connected to the plurality of first conductive lines 110, respectively. Each of the plurality of gate structures GS may penetrate the vertical semiconductor patterns VC, spaced apart from each other in the second direction D2, of the plurality of vertical semiconductor patterns VC. Each of the plurality of vertical semiconductor patterns VC may surround the outer surface GS_S of a corresponding gate structure GS of the plurality of gate structures GS. The channel region 120 of each of the plurality of vertical semiconductor patterns VC may surround the outer surface GS_S of the corresponding gate structure GS.

Referring again to FIGS. 2 and 3, a plurality of second conductive lines 150 may be formed on the interlayer insulating layer 140 and the plurality of vertical semiconductor patterns VC. The plurality of second conductive lines 150 may be formed to cross the plurality of gate structures GS. The plurality of second conductive lines 150 may extend in the first direction D1 and may be spaced apart from each other in the second direction D2. For example, the formation of the plurality of second conductive lines 150 may include forming a second conductive layer on the interlayer insulating layer 140, and patterning the second conductive layer. The vertical semiconductor patterns VC, spaced apart from each other in the first direction D1, of the plurality of vertical semiconductor patterns VC may be connected to a corresponding one of the plurality of second conductive lines 150. The vertical semiconductor patterns VC, spaced apart from each other in the second direction D2, of the plurality of vertical semiconductor patterns VC may be connected to the plurality of second conductive lines 150, respectively.

Figure 22:
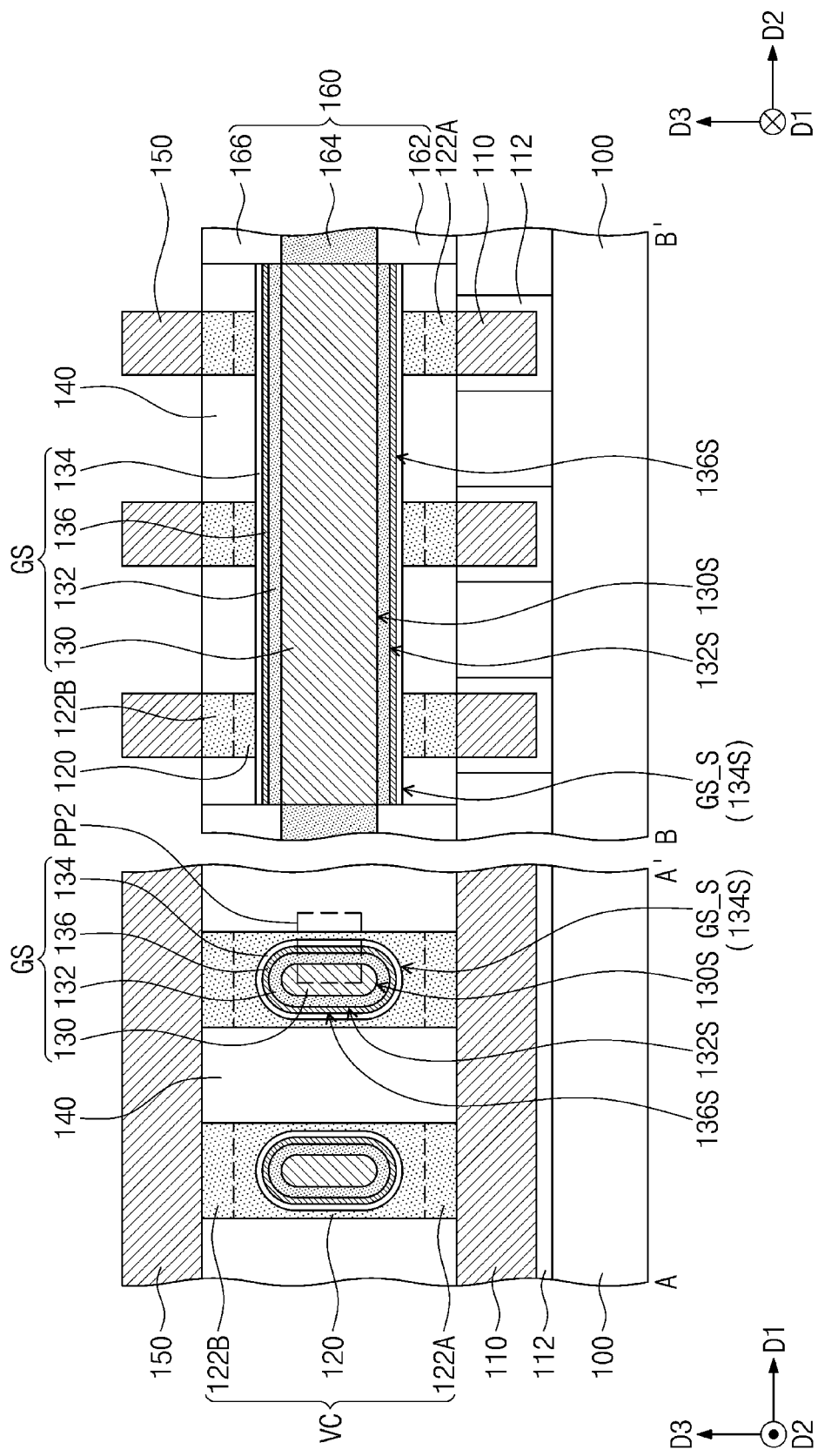
FIG. 22 is a cross-sectional view corresponding to the lines A-A' and B-B' of FIG. 2 to illustrate a semiconductor device according to some embodiments of the inventive concepts.
Figure 23:
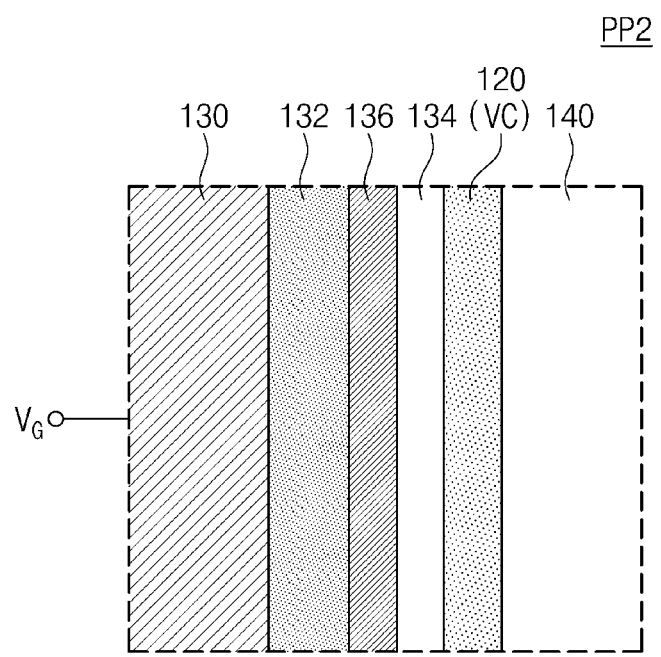
FIG. 23 is an enlarged view of a portion 'PP2' of FIG. 22.

FIG. 22 is a cross-sectional view corresponding to the lines A-A' and B-B' of FIG. 2 to illustrate a semiconductor device according to some embodiments of the inventive concepts. FIG. 23 is an enlarged view of a portion 'PP2' of FIG. 22. Hereinafter, differences between the present embodiments and the embodiments described with reference to FIGS. 1 to 5 will be mainly described for the purpose of ease and convenience in explanation.

Referring to FIGS. 22 and 23, according to some embodiments, each of the plurality of gate structures GS may further include a metal pattern 136 between the ferroelectric pattern 132 and the gate insulating pattern 134. The metal pattern 136 may include or may be formed of a metal (e.g., Pt, etc.) and/or a metal oxide (e.g., $RuO_2$, $IrO_2$, $LaSrCoO_3$, etc.). The metal pattern 136 may be used to easily maintain the polarity Pr of the ferroelectric pattern 132 described with reference to FIGS. 4A, 4B and 5.

The metal pattern 136 may surround the outer surface 132S of the ferroelectric pattern 132 and may extend in the second direction D2 along the gate electrode 130. The metal pattern 136 may be disposed inside each of corresponding vertical semiconductor patterns VC spaced apart from each other in the second direction D2, and each of the corresponding vertical semiconductor patterns VC may surround an outer surface 136S of the metal pattern 136. The gate insulating pattern 134 may be disposed between the outer surface 136S of the metal pattern 136 and each of the corresponding vertical semiconductor patterns VC. The gate insulating pattern 134 may surround the outer surface 136S of the metal pattern 136 and may extend in the second direction D2 along the gate electrode 130. The gate insulating pattern 134 may be disposed inside each of the corresponding vertical semiconductor patterns VC, and each of the corresponding vertical semiconductor patterns VC may surround the outer surface 134S of the gate insulating pattern 134.

The gate electrode 130, the ferroelectric pattern 132, the metal pattern 136 and the gate insulating pattern 134 may be disposed in the channel region 120 of each of the corresponding vertical semiconductor patterns VC, and the channel region 120 of each of the corresponding vertical semiconductor patterns VC may surround the outer surfaces 130S, 132S, 136S and 134S of the gate electrode 130, the ferroelectric pattern 132, the metal pattern 136 and the gate insulating pattern 134.

Figure 24:
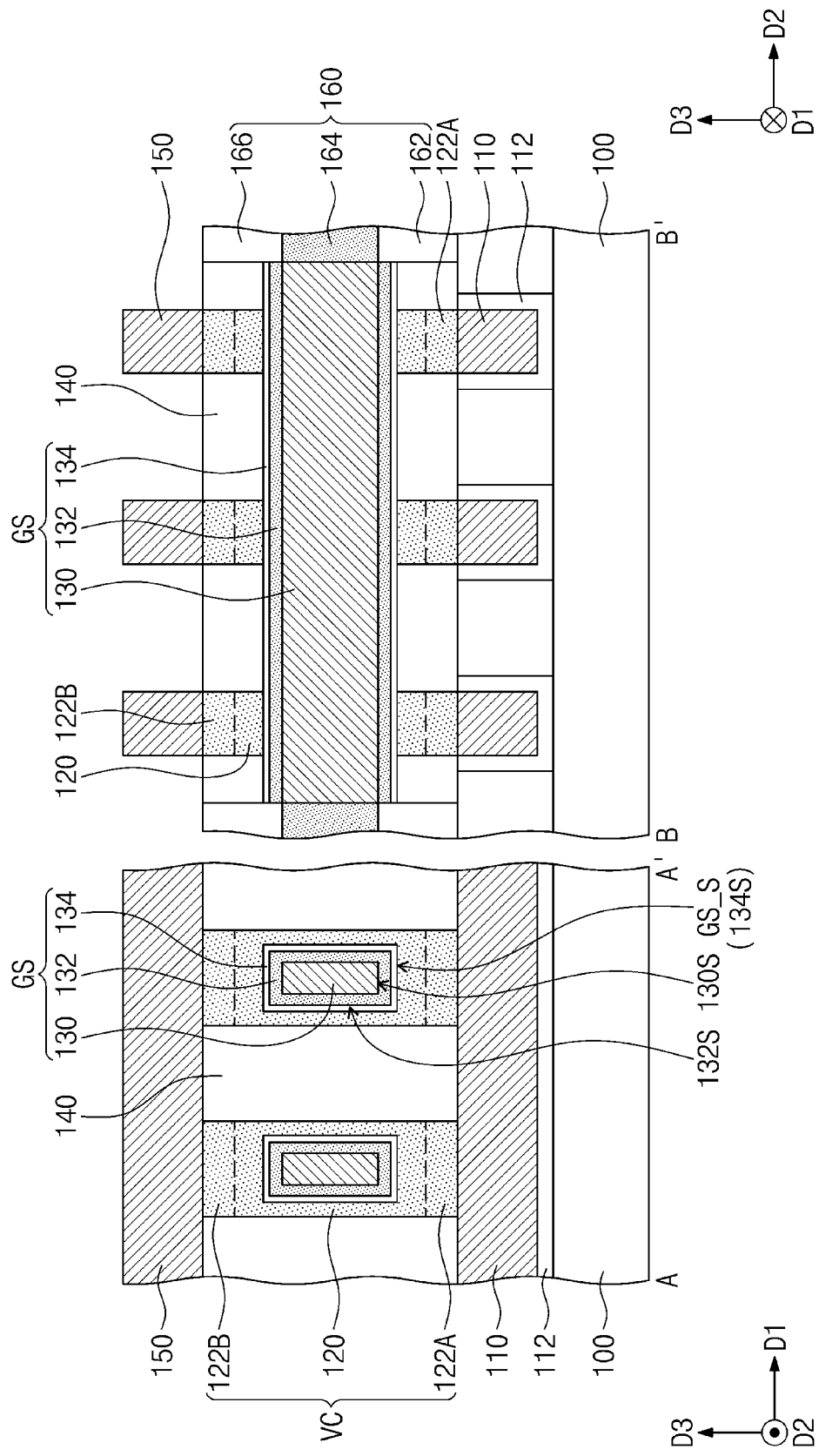
FIG. 24 is a cross-sectional view corresponding to the lines A-A' and B-B' of FIG. 2 to illustrate a semiconductor device according to some embodiments of the inventive concepts.

FIG. 24 is a cross-sectional view corresponding to the lines A-A' and B-B' of FIG. 2 to illustrate a semiconductor device according to some embodiments of the inventive concepts. Hereinafter, differences between the present embodiments and the embodiments described with reference to FIGS. 1 to 5 will be mainly described for the purpose of ease and convenience in explanation.

Referring to FIG. 24, according to some embodiments, the outer surface 130S of the gate electrode 130 may have an angular shape when viewed in a cross-sectional view. For example, the gate electrode 130 may have an angular pillar shape. Each of the ferroelectric pattern 132 and the gate insulating pattern 134 may have an angular ring shape surrounding the outer surface 130S of the gate electrode 130 when viewed in a cross-sectional view. The outer surface GS_S of each of the plurality of gate structures GS may have an angular shape when viewed in a cross-sectional view. For example, each of the plurality of gate structures GS may have an angular pillar shape. The angular shapes described for this embodiment may be a rectangular shape, For example.

Figure 25:
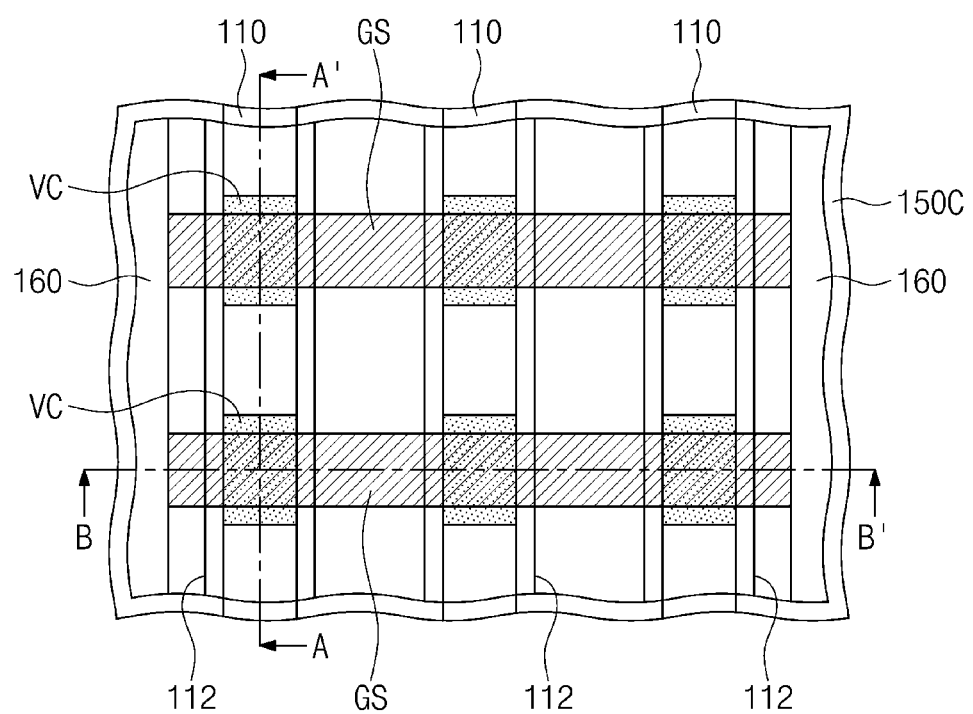
FIG. 25 is a plan view illustrating a semiconductor device according to some embodiments of the inventive concepts.
Figure 25:
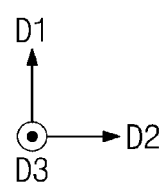
Figure 26:
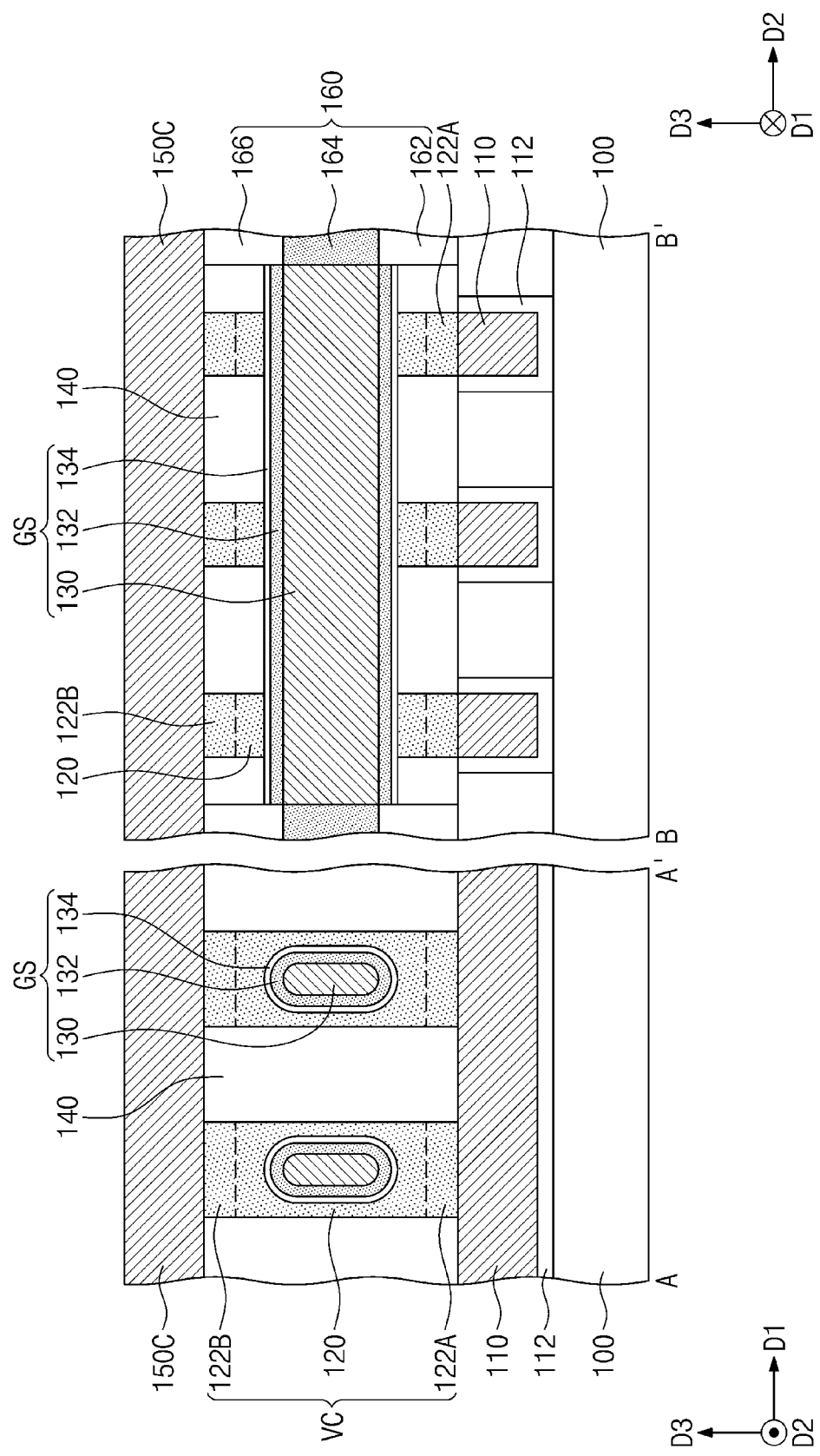
FIG. 26 is a cross-sectional view taken along lines A-A' and B-B' of FIG. 25.

FIG. 25 is a plan view illustrating a semiconductor device according to some embodiments of the inventive concepts, and FIG. 26 is a cross-sectional view taken along lines A-A' and B-B' of FIG. 25. Hereinafter, differences between the present embodiments and the embodiments described with reference to FIGS. 1 to 5 will be mainly described for the purpose of ease and convenience in explanation.

Referring to FIGS. 25 and 26, according to some embodiments, a common conductive line 150C may be disposed on the interlayer insulating layer 140 and the plurality of vertical semiconductor patterns VC. The common conductive line 150C may have a plate shape and may cover the plurality of vertical semiconductor patterns VC. The common conductive line 150C may be connected in common to the plurality of vertical semiconductor patterns VC spaced apart from each other in the first direction D1 and the second direction D2. In some embodiments, the plurality of first conductive lines 110 may function as bit lines, and the common conductive line 150C may function as a common source line.

Figure 27:
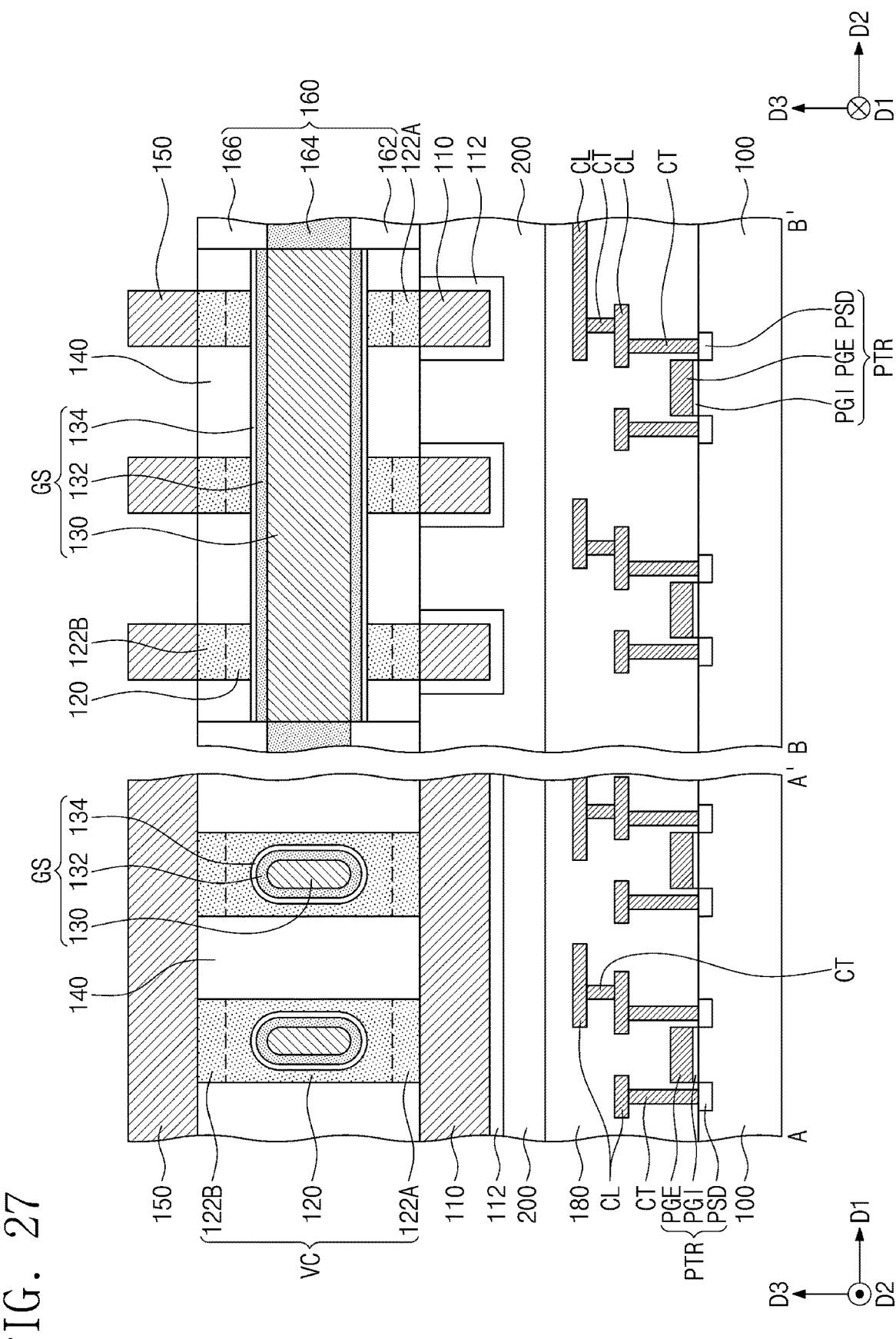
FIG. 27 is a cross-sectional view corresponding to the lines A-A' and B-B' of FIG. 2 to illustrate a semiconductor device according to some embodiments of the inventive concepts.

FIG. 27 is a cross-sectional view corresponding to the lines A-A' and B-B' of FIG. 2 to illustrate a semiconductor device according to some embodiments of the inventive concepts. Hereinafter, differences between the present embodiments and the embodiments described with reference to FIGS. 1 to 5 will be mainly described for the purpose of ease and convenience in explanation. Furthermore, though the example embodiment of FIG. 2 is shown as part of FIG. 27, the embodiments of the other figures (e.g., FIG. 22-26 or 28) may be used in place of the embodiment of FIG. 2. It should be noted that the different variations shown in FIGS. 22-28 can be combined in different ways so that the different features can be adjusted according to a desired effect.

Referring to FIG. 27, according to some embodiments, a peripheral circuit structure PTR, CT and CL may be disposed on the substrate 100, and a lower interlayer insulating layer 180 may be disposed on the substrate 100 to cover the peripheral circuit structure PTR, CT and CL. For example, the lower interlayer insulating layer 180 may include or be formed of at least one of silicon oxide, silicon nitride, or silicon oxynitride.

A cell structure including the plurality of first conductive lines 110, the plurality of vertical semiconductor patterns VC, the plurality of gate structures GS and the plurality of second conductive lines 150 may be disposed on the lower interlayer insulating layer 180. According to some embodiments, an upper layer 200 may be disposed on the lower interlayer insulating layer 180, and the cell structure may be disposed on the upper layer 200. For example, the upper layer 200 may be an insulating layer or a semiconductor layer. In some embodiments, the plurality of first conductive lines 110 may be buried in the upper layer 200, and a buried insulating pattern 112 may be disposed between the upper layer 200 and each of the plurality of first conductive lines 110.

The peripheral circuit structure PTR, CT and CL may include peripheral transistors PTR on the substrate 100. The peripheral transistors PTR may constitute a peripheral circuit for driving memory cells in the cell structure. The plurality of first conductive lines 110, the plurality of gate structures GS and the plurality of second conductive lines 150 may be electrically connected to the peripheral transistors PTR and may be controlled by the peripheral transistors PTR. Each of the peripheral transistors PTR may include a peripheral gate electrode PGE on the substrate 100, a peripheral gate insulating pattern PGI between the substrate 100 and the peripheral gate electrode PGE, and peripheral source/drain regions PSD disposed in the substrate 100 at both sides of the peripheral gate electrode PGE.

The peripheral circuit structure PTR, CT and CL may further include peripheral contacts CT connected to terminals of the peripheral transistors PTR, and peripheral conductive lines CL connected to the peripheral contacts CT. The peripheral contacts CT and the peripheral conductive lines CL may include or be formed of a conductive material. The peripheral transistors PTR may be electrically connected to the plurality of first conductive lines 110, the plurality of gate structures GS and the plurality of second conductive lines 150 through the peripheral contacts CT and the peripheral conductive lines CL.

Figure 28:
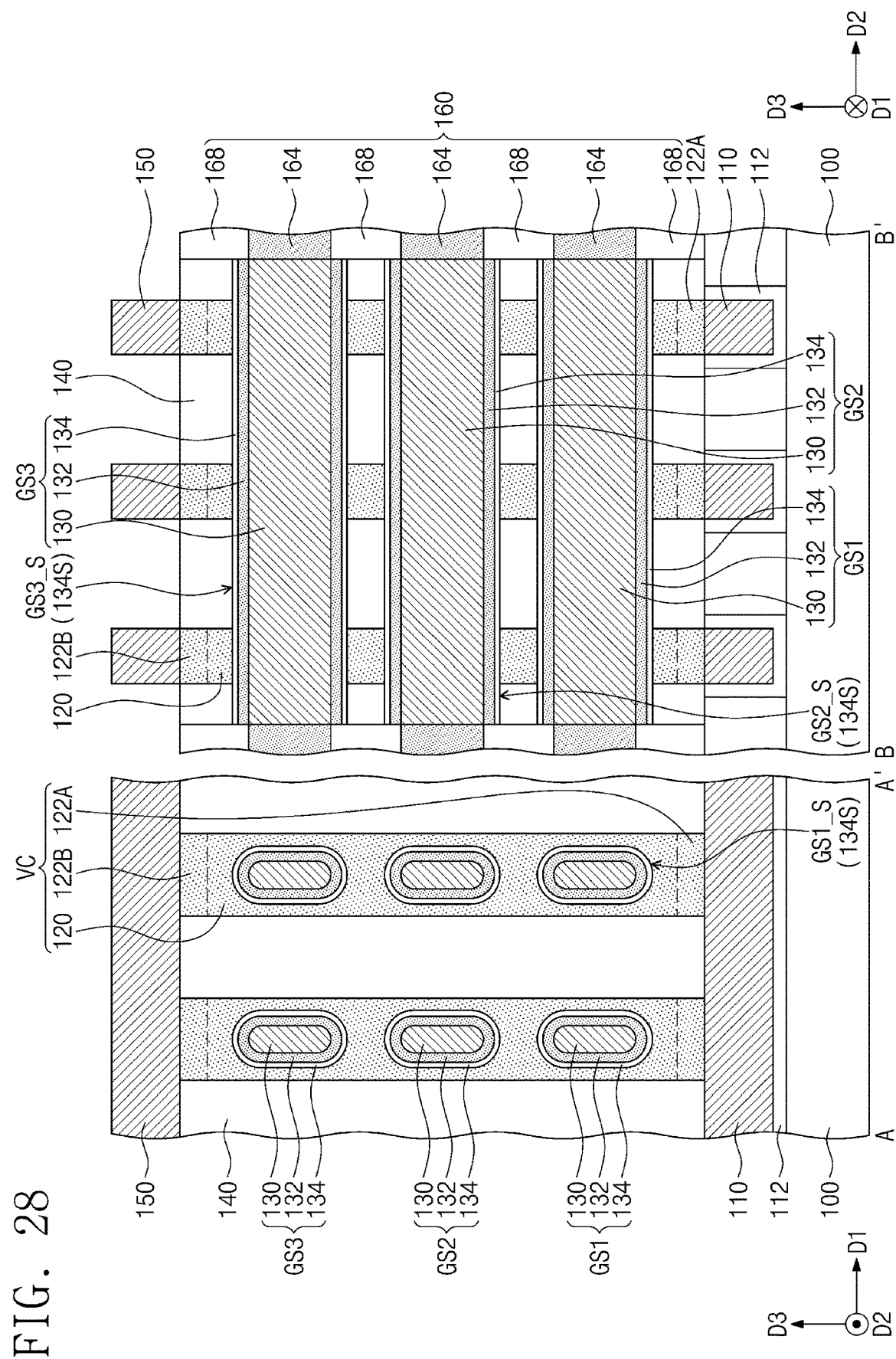
FIG. 28 is a cross-sectional view corresponding to the lines A-A' and B-B' of FIG. 2 to illustrate a semiconductor device according to some embodiments of the inventive concepts.

FIG. 28 is a cross-sectional view corresponding to the lines A-A' and B-B' of FIG. 2 to illustrate a semiconductor device according to some embodiments of the inventive concepts. Hereinafter, differences between the present embodiments and the embodiments described with reference to FIGS. 1 to 5 will be mainly described for the purpose of ease and convenience in explanation.

Referring to FIG. 28, a plurality of first gate structures GS1 may be disposed on the plurality of first conductive lines 110 and may intersect the plurality of first conductive lines 110. The plurality of first gate structures GS1 may be spaced apart from each other in the first direction D1 and may extend in the second direction D2. Each of the plurality of first gate structures GS1 may penetrate corresponding vertical semiconductor patterns VC, spaced apart from each other in the second direction D2, of the plurality of vertical semiconductor patterns VC. Each of the plurality of first gate structures GS1 may penetrate the channel regions 120 of the corresponding vertical semiconductor patterns VC.

A plurality of second gate structures GS2 may be disposed on the plurality of first gate structures GS1 and may be spaced apart from the plurality of first gate structures GS1 in the third direction D3. The plurality of second gate structures GS2 may extend in parallel to the plurality of first gate structures GS1. The plurality of second gate structures GS2 may be spaced apart from each other in the first direction D1 and may extend in the second direction D2. Each of the plurality of second gate structures GS2 may penetrate corresponding vertical semiconductor patterns VC, spaced apart from each other in the second direction D2, of the plurality of vertical semiconductor patterns VC. Each of the plurality of second gate structures GS2 may penetrate the channel regions 120 of the corresponding vertical semiconductor patterns VC. In addition, a plurality of third gate structures GS3 may be disposed on the plurality of second gate structures GS2 and may be spaced apart from the plurality of second gate structures GS2 in the third direction D3. The plurality of third gate structures GS3 may extend in parallel to the plurality of second gate structures GS2. The plurality of third gate structures GS3 may be spaced apart from each other in the first direction D1 and may extend in the second direction D2. Each of the plurality of third gate structures GS3 may penetrate corresponding vertical semiconductor patterns VC, spaced apart from each other in the second direction D2, of the plurality of vertical semiconductor patterns VC. Each of the plurality of third gate structures GS3 may penetrate the channel regions 120 of the corresponding vertical semiconductor patterns VC.

Each of the plurality of first gate structures GS1, the plurality of second gate structures GS2 and the plurality of third gate structures GS3 may include the gate electrode 130, the ferroelectric pattern 132 and the gate insulating pattern 134, described with reference to FIGS. 1 to 5.

The plurality of first gate structures GS1, the plurality of second gate structures GS2 and the plurality of third gate structures GS3 are illustrated as an example. However, the number of the gate structures stacked on the substrate 100 in the third direction D3 is not limited thereto. Unlike FIG. 28, a plurality of additional gate structures may be stacked on the plurality of third gate structures GS3 and may be spaced apart from the plurality of third gate structures GS3 in the third direction D3, or only two levels of gate structures may be included (e.g., GS1 and GS2).

Each of the plurality of vertical semiconductor patterns VC may surround an outer surface GS1_S of a corresponding first gate structure GS1 of the plurality of first gate structures GS1, an outer surface GS2_S of a corresponding second gate structure GS2 of the plurality of second gate structures GS2, and an outer surface GS3_S of a corresponding third gate structure GS3 of the plurality of third gate structures GS3. The channel region 120 of each of the plurality of vertical semiconductor patterns VC may surround the outer surface GS1_S of the corresponding first gate structure GS1, the outer surface GS2_S of the corresponding second gate structure GS2, and the outer surface GS3_S of the corresponding third gate structure GS3. Each of the plurality of vertical semiconductor patterns VC and the corresponding first to third gate structures GS1, GS2 and GS3 penetrating therethrough may constitute a ferroelectric field-effect transistor having a multi-channel structure.

According to some embodiments, support patterns 160 may be disposed on the substrate 100 and may support the plurality of first gate structures GS1, the plurality of second gate structures GS2, and the plurality of third gate structures GS3. One of the support patterns 160 may be in contact with end portions of the plurality of first gate structures GS1, end portions of the plurality of second gate structures GS2, and end portions of the plurality of third gate structures GS3. Another of the support patterns 160 may be in contact with other end portions of the plurality of first gate structures GS1, other end portions of the plurality of second gate structures GS2, and other end portions of the plurality of third gate structures GS3. Each of the support patterns 160 may include insulating patterns 168 and sacrificial patterns 164, which are alternately stacked in the third direction D3 on the substrate 100. The sacrificial patterns 164 of the one of the support patterns 160 may be in contact with the end portions of the plurality of first gate structures GS1, the end portions of the plurality of second gate structures GS2, and the end portions of the plurality of third gate structures GS3. The sacrificial patterns 164 of the other of the support patterns 160 may be in contact with the other end portions of the plurality of first gate structures GS1, the other end portions of the plurality of second gate structures GS2, and the other end portions of the plurality of third gate structures GS3.

According to the embodiments of the inventive concepts, the plurality of vertical semiconductor patterns may be two-dimensionally arranged on the substrate, from a plan view, and each of the plurality of gate structures may extend in one direction to penetrate corresponding ones of the plurality of vertical semiconductor patterns. Each of the plurality of gate structures may be disposed inside the corresponding vertical semiconductor patterns. Thus, it is possible to prevent disturbance between the gate structures adjacent to each other, and it may be easy to reduce a size of a memory cell structure including the plurality of gate structures and the plurality of vertical semiconductor patterns. As a result, a highly integrated semiconductor device and a method of manufacturing the same may be provided.

In addition, each of the plurality of gate structures may include the gate electrode, the ferroelectric pattern surrounding the outer surface of the gate electrode, and the gate insulating pattern surrounding the outer surface of the ferroelectric pattern. Since the ferroelectric pattern surrounds the outer surface of the gate electrode, the intensity of the electric field applied to the ferroelectric pattern may be increased, and the intensity of the electric field applied to the gate insulating pattern may be reduced. Thus, the polarity properties of the ferroelectric pattern may be improved, and the endurance of the gate insulating pattern may be improved. As a result, a semiconductor device with improved operating characteristics and reliability and a method of manufacturing the same may be provided.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

Spatially relative terms, such as "beneath," "below," "lower," "above," "upper," "top," "bottom," and the like, may be used herein for ease of description to describe positional relationships, such as illustrated in the figures, for example. It will be understood that the spatially relative terms encompass different orientations of the device in addition to the orientation depicted in the figures.

What is claimed is:
1. A semiconductor device comprising:
a plurality of first conductive lines extending in a first direction and spaced apart from each other in a second direction intersecting the first direction, the first direction and second direction being horizontal directions;
a plurality of vertical semiconductor patterns disposed on the plurality of first conductive lines, respectively;

a gate electrode crossing each of the plurality of first conductive lines and penetrating each of the plurality of vertical semiconductor patterns;

a ferroelectric pattern between the gate electrode and each of the plurality of vertical semiconductor patterns; and a gate insulating pattern between the ferroelectric pattern and each of the plurality of vertical semiconductor patterns, wherein each of the plurality of vertical semiconductor patterns extends in a vertical direction perpendicular to the horizontal directions and includes a first dopant region and a second dopant region, which are spaced apart from each other in the vertical direction, and wherein the gate electrode, the ferroelectric pattern, and the gate insulating pattern are between the first dopant region and the second dopant region.

2. The semiconductor device of claim 1, wherein, where the gate electrode penetrates each of the plurality of vertical semiconductor patterns, the gate electrode is disposed inside of the respective vertical semiconductor pattern, and the respective vertical semiconductor pattern surrounds an outer surface of the gate electrode.

3. The semiconductor device of claim 2, wherein the ferroelectric pattern surrounds the outer surface of the gate electrode, and each of the plurality of vertical semiconductor patterns surrounds an outer surface of the ferroelectric pattern.

4. The semiconductor device of claim 3, wherein the gate insulating pattern surrounds the outer surface of the ferroelectric pattern, and each of the plurality of vertical semiconductor patterns surrounds an outer surface of the gate insulating pattern.

5. The semiconductor device of claim 2, wherein the outer surface of the gate electrode has a rounded shape when viewed in a cross-sectional view.

6. The semiconductor device of claim 2, wherein the outer surface of the gate electrode has an angular shape when viewed in a cross-sectional view.

7. The semiconductor device of claim 1, further comprising:

a substrate, wherein each first conductive line of the plurality of first conductive lines is disposed on or in the substrate, and the first direction and the second direction are parallel to a top surface of the substrate, and wherein the vertical direction is perpendicular to the top surface of the substrate.

8. The semiconductor device of claim 7, wherein each of the plurality of vertical semiconductor patterns comprises:

a channel region between the first dopant region and the second dopant region, and wherein the gate electrode, the ferroelectric pattern, and the gate insulating pattern penetrate the channel region of each of the plurality of vertical semiconductor patterns.

9. The semiconductor device of claim 7, wherein each first conductive line of the plurality of first conductive lines is buried in the substrate.

10. The semiconductor device of claim 7, further comprising:

an additional gate electrode spaced apart from the gate electrode in the third vertical direction, the additional gate electrode extending in parallel to the gate electrode to penetrate each of the plurality of vertical semiconductor patterns;

an additional ferroelectric pattern between the additional gate electrode and each of the plurality of vertical semiconductor patterns; and an additional gate insulating pattern between the additional ferroelectric pattern and each of the plurality of vertical semiconductor patterns.

11. The semiconductor device of claim 1, further comprising:

a plurality of second conductive lines disposed on the plurality of vertical semiconductor patterns, wherein the plurality of second conductive lines are connected to the plurality of vertical semiconductor patterns, respectively.

12. The semiconductor device of claim 1, further comprising:

a common conductive line disposed on the plurality of vertical semiconductor patterns, wherein the common conductive line is connected to the plurality of vertical semiconductor patterns.

13. The semiconductor device of claim 1, further comprising:

a metal pattern between the ferroelectric pattern and the gate insulating pattern.

14. The semiconductor device of claim 1, further comprising:

a substrate;

a peripheral circuit structure on the substrate; and a lower interlayer insulating layer disposed on the substrate and covering the peripheral circuit structure, wherein the plurality of first conductive lines are disposed on the lower interlayer insulating layer.

15. A semiconductor device comprising:

a plurality of vertical semiconductor patterns on a substrate, the plurality of vertical semiconductor patterns spaced apart from each other in a first direction and a second direction which are parallel to a top surface of the substrate and intersect each other, and the plurality of vertical semiconductor patterns extending in a third direction perpendicular to the top surface of the substrate; and a plurality of gate structures spaced apart from each other in the first direction and extending in the second direction on the substrate, wherein each of the plurality of gate structures penetrates each vertical semiconductor pattern of corresponding vertical semiconductor patterns spaced apart from each other in the second direction, of the plurality of vertical semiconductor patterns, wherein each of the plurality of gate structures comprises:

a gate electrode penetrating the corresponding vertical semiconductor patterns;

a ferroelectric pattern between the gate electrode and each of the corresponding vertical semiconductor patterns;

a gate insulating pattern between the ferroelectric pattern and each of the corresponding vertical semiconductor patterns;

first conductive lines disposed below the vertical semiconductor patterns and connected to the vertical semiconductor patterns; and second conductive lines disposed above the vertical semiconductor patterns and connected to the vertical semiconductor patterns.

16. The semiconductor device of claim 15, wherein for each gate electrode, each of the corresponding vertical semiconductor patterns surrounds an outer surface of the gate electrode, and wherein for each gate electrode, the ferroelectric pattern and the gate insulating pattern are disposed between the outer surface of the gate electrode and each of the corresponding vertical semiconductor patterns.

17. The semiconductor device of claim 16, wherein for each gate electrode, the ferroelectric pattern surrounds the outer surface of the gate electrode, and the gate insulating pattern surrounds an outer surface of the ferroelectric pattern.

18. The semiconductor device of claim 15, wherein each of the plurality of gate structures further comprises:
a metal pattern between the ferroelectric pattern and the gate insulating pattern.

19. The semiconductor device of claim 15, wherein each of the plurality of vertical semiconductor patterns comprises:
a first dopant region and a second dopant region, which are spaced apart from each other in the third direction; and
a channel region between the first and second dopant regions,
wherein for each gate electrode, the gate electrode penetrates the channel regions of the corresponding vertical semiconductor patterns.

20. The semiconductor device of claim 15, wherein:
the first conductive lines are buried in the substrate; and
the second conductive lines are on the plurality of vertical semiconductor patterns,
the first conductive lines extend in the first direction and are spaced apart from each other in the second direction, and each of the first conductive lines is connected to corresponding vertical semiconductor patterns, spaced apart from each other in the first direction, of the plurality of vertical semiconductor patterns, and
the second conductive lines extend in the first direction and are spaced apart from each other in the second direction, and each of the second conductive lines is connected to corresponding vertical semiconductor patterns spaced apart from each other in the first direction.

21. A semiconductor device comprising:
a plurality of first conductive lines each continuously extending lengthwise in a first direction, the plurality of first conductive lines spaced apart from each other in a second direction intersecting the first direction, the first direction and second direction being horizontal directions;
a plurality of vertical semiconductor patterns disposed on the plurality of first conductive lines, so that each first conductive line is disposed below two or more vertical semiconductor patterns of the plurality of vertical semiconductor patterns in a third direction that is a vertical direction perpendicular to the horizontal direction;
a gate electrode crossing the plurality of first conductive lines and surrounded by each vertical semiconductor pattern of a group of vertical semiconductor patterns of the plurality of vertical semiconductor patterns;
a ferroelectric pattern between the gate electrode and each vertical semiconductor pattern of the group of vertical semiconductor patterns; and
a gate insulating pattern between the ferroelectric pattern and each vertical semiconductor pattern of the group of vertical semiconductor patterns.

* * * * *